(12) United States Patent
Thacker et al.

(10) Patent No.: US 9,297,971 B2
(45) Date of Patent: Mar. 29, 2016

(54) HYBRID-INTEGRATED PHOTONIC CHIP PACKAGE WITH AN INTERPOSER

(71) Applicant: Oracle International Corporation, Redwood City, CA (US)

(72) Inventors: Hiren D. Thacker, San Diego, CA (US); Ashok V. Krishnamoorthy, San Diego, CA (US); Robert David Hopkins, II, Foster City, CA (US); Jon Lexau, Beaverton, OR (US); Xuezhe Zheng, San Diego, CA (US); Ronald Ho, Mountain View, CA (US); Ivan Shubin, San Diego, CA (US); John E. Cunningham, San Diego, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 0 days.

(21) Appl. No.: 14/047,978

(22) Filed: Oct. 7, 2013

(65) Prior Publication Data
US 2014/0321804 A1 Oct. 30, 2014

Related U.S. Application Data

(63) Continuation-in-part of application No. 14/047,910, filed on Oct. 7, 2013.

(60) Provisional application No. 61/816,420, filed on Apr. 26, 2013.

(51) Int. Cl.
*G02B 6/42* (2006.01)
*H01L 25/065* (2006.01)
(Continued)

(52) U.S. Cl.
CPC .......... *G02B 6/4274* (2013.01); *H01L 25/0652* (2013.01); *H01L 25/0655* (2013.01); *H01L 23/49827* (2013.01); *H01L 24/13* (2013.01); *H01L 24/14* (2013.01); *H01L 24/16* (2013.01); *H01L 24/32* (2013.01); *H01L 24/72* (2013.01); *H01L 24/73* (2013.01); *H01L 24/81* (2013.01); *H01L 24/92* (2013.01);
(Continued)

(58) Field of Classification Search
CPC ............ G02B 6/12004; G02B 6/4274; H01L 23/49827; H01L 24/13; H05K 3/36
USPC .......................................................... 385/14
See application file for complete search history.

(56) References Cited

U.S. PATENT DOCUMENTS 5,244,143 A * 9/1993 Ference et al. ........... 228/180.21
5,371,654 A * 12/1994 Beaman et al. ............... 361/744
(Continued)

*Primary Examiner* — Peter Radkowski
(74) *Attorney, Agent, or Firm* — Park, Vaughan, Fleming & Dowler LLP; Steven E. Stupp

(57) ABSTRACT

A chip package includes an optical integrated circuit (such as a hybrid integrated circuit) and an integrated circuit that are proximate to each other in the chip package. The integrated circuit includes electrical circuits, such as memory or a processor, and the optical integrated circuit communicates optical signals with very high bandwidth. Moreover, a front surface of the integrated circuit is electrically coupled to a top surface of an interposer, and this top surface is in turn electrically coupled to a front surface of an input/output (I/O) integrated circuit that faces the top surface. Furthermore, the front surface of the I/O integrated circuit is electrically coupled to a top surface of the optical integrated circuit, where the top surface of the optical integrated circuit faces the front surface of the I/O integrated circuit.

20 Claims, 20 Drawing Sheets

(51) Int. Cl.
 *H01L 23/00* (2006.01)
 *H01L 23/498* (2006.01)
 *H05K 3/36* (2006.01)

(52) U.S. Cl.
 CPC ............... *H01L 2224/0401* (2013.01); *H01L 2224/13147* (2013.01); *H01L 2224/1403* (2013.01); *H01L 2224/16145* (2013.01); *H01L 2224/16225* (2013.01); *H01L 2224/32225* (2013.01); *H01L 2224/72* (2013.01); *H01L 2224/73204* (2013.01); *H01L 2224/73253* (2013.01); *H01L 2224/81203* (2013.01); *H01L 2224/81815* (2013.01); *H01L 2224/92125* (2013.01); *H01L 2225/06513* (2013.01); *H01L 2225/06517* (2013.01); *H01L 2225/06534* (2013.01); *H01L 2225/06589* (2013.01); *H01L 2924/14* (2013.01); *H01L 2924/157* (2013.01); *H01L 2924/15192* (2013.01); *H01L 2924/15311* (2013.01); *H01L 2924/15787* (2013.01); *H01L 2924/15788* (2013.01); *H01L 2924/37001* (2013.01); *H05K 3/36* (2013.01); *H05K 2201/10484* (2013.01)

(56) References Cited

U.S. PATENT DOCUMENTS

| | | | |
|---|---|---|---|
| 6,150,724 A * | 11/2000 | Wenzel et al. | 257/777 |
| 6,343,171 B1 * | 1/2002 | Yoshimura et al. | 385/50 |
| 6,841,842 B2 * | 1/2005 | Li | 257/459 |
| 6,910,812 B2 * | 6/2005 | Pommer et al. | 385/92 |
| 7,082,032 B1 * | 7/2006 | Barsun et al. | 361/703 |
| 7,504,701 B2 * | 3/2009 | Moribayashi et al. | 257/440 |
| 7,786,427 B2 * | 8/2010 | Forrest et al. | 250/227.11 |
| 7,893,531 B2 * | 2/2011 | Mitchell et al. | 257/727 |
| 7,915,699 B2 * | 3/2011 | Krishnamoorthy et al. | 257/428 |
| 8,039,308 B2 * | 10/2011 | Mitchell et al. | 438/107 |
| 8,148,202 B2 * | 4/2012 | Krishnamoorthy et al. | 438/109 |
| 8,218,334 B2 * | 7/2012 | Chow et al. | 361/790 |
| 2002/0003232 A1 * | 1/2002 | Ahn et al. | 257/81 |
| 2003/0185484 A1 * | 10/2003 | Chakravorty et al. | 385/14 |
| 2004/0037512 A1 * | 2/2004 | Cho et al. | 385/88 |
| 2004/0047538 A1 * | 3/2004 | Howland et al. | 385/14 |
| 2004/0264837 A1 * | 12/2004 | Ogawa | 385/14 |
| 2005/0180679 A1 * | 8/2005 | Shimizu et al. | 385/14 |
| 2010/0146181 A1 * | 6/2010 | Lichtenegger | 710/303 |
| 2011/0108716 A1 * | 5/2011 | Shiraishi | 250/227.24 |
| 2011/0111559 A1 * | 5/2011 | Mitchell et al. | 438/107 |
| 2011/0136297 A1 * | 6/2011 | Krishnamoorthy et al. | 438/107 |
| 2011/0223778 A1 * | 9/2011 | Chow et al. | 439/66 |
| 2011/0274392 A1 * | 11/2011 | Miyatake | 385/33 |
| 2012/0056332 A1 * | 3/2012 | Rathburn | 257/774 |
| 2012/0063718 A1 * | 3/2012 | Steijer et al. | 385/14 |
| 2012/0217287 A1 * | 8/2012 | Kumar et al. | 228/178 |
| 2013/0223789 A1 * | 8/2013 | Lee et al. | 385/14 |
| 2014/0063765 A1 * | 3/2014 | Kashiwakura | 361/782 |
| 2014/0203175 A1 * | 7/2014 | Kobrinsky et al. | 250/214.1 |

* cited by examiner

HYBRID-INTEGRATED PHOTONIC CHIP PACKAGE WITH AN INTERPOSER

CROSS-REFERENCE TO RELATED APPLICATIONS

This application is a continuation-in-part of, and hereby claims priority under 35 U.S.C. §120 to, U.S. Non-provisional patent application Ser. No. 14/047,910, entitled "Hybrid-Integrated Photonic Chip Package with an Interposer," by Hiren D. Thacker, Frankie Y. Liu, Robert D. Hopkins, Jon Lexau, Xuezhe Zheng, Guoliang Li, Ivan Shubin, Ronald Ho, John E. Cunningham, and Ashok V. Krishnamoorthy, filed on Oct. 7, 2013, the contents of which are herein incorporated by reference in their entirety for all purposes. This application and U.S. Non-provisional patent application Ser. No. 14/047,910 claim priority, under 35 U.S.C. §119(e), to U.S. Provisional Application Ser. No. 61/816,420, entitled "Multi Terabit-Per-Second Wavelength-Division-Multiplexed Photonic I/O Package," by Hiren D. Thacker, Frankie Y. Liu, Robert D. Hopkins, Jon Lexau, Xuezhe Zheng, Guoliang Li, Ivan Shubin, Ronald Ho, John E. Cunningham, and Ashok V. Krishnamoorthy, filed on Apr. 26, 2013, the contents of which are herein incorporated by reference in their entirety for all purposes.

BACKGROUND

1. Field

The present disclosure generally relates to a chip package that accommodates semiconductor chips. More specifically, the present disclosure relates to a hybrid-integrated chip package that includes a substrate with adjacent payload and photonic chips.

2. Related Art

As integrated-circuit (IC) technology continues to scale to smaller critical dimensions, it is increasingly difficult for existing interconnection technologies to provide suitable communication characteristics, such as: high bandwidth, low power, reliability and low cost. Engineers and researchers are investigating a variety of interconnect technologies to address these problems, and to enable future high-density, high-performance systems.

One interconnect technology to address these challenges, which is the subject of ongoing research, is optical communication. In principle, optical communication can be used to communicate large amounts of data. However, while photonic technologies based on vertical cavity surface-emitting lasers (VCSELs) and optical fibers are typically a convenient and cost-effective solution to communicate modest amounts of data in certain parts of systems (such as between racks and, in certain cases, between boards within a rack), it is often difficult to scale these photonic components to meet the bandwidth, size, and power requirements of input/output (I/O) interfaces for future chips.

Alternatively, optical interconnects or links based on silicon photonics are attractive candidates for interconnect technology because they can be readily scaled on optical integrated circuits. However, it can be difficult to integrate optical integrated circuits with conventional integrated circuits in existing chip packages.

Hence, what is needed is a chip package that does not suffer from the above-described problems.

SUMMARY

One embodiment of the present disclosure provides a chip package that includes: an integrated circuit having a front surface with integrated-circuit connector pads; integrated-circuit electrical connectors electrically coupled to the integrated-circuit connector pads; and an interposer having a top surface, facing the front surface of the integrated circuit, with first interposer connector pads, electrically coupled to the integrated-circuit electrical connectors, and second interposer connector pads. Moreover, the chip package includes: input/output (I/O)-integrated-circuit electrical connectors electrically coupled to the second interposer connector pads; and an I/O integrated circuit having a front surface, facing the top surface, with first I/O-integrated-circuit connector pads electrically coupled to the I/O-integrated-circuit electrical connectors, and second I/O-integrated-circuit connector pads, where the I/O integrated circuit is proximate to the integrated circuit on a same side of the interposer, and the I/O integrated circuit contains high-speed I/O circuits and may serialize/deserialize data. Furthermore, the chip package includes: optical-integrated-circuit electrical connectors electrically coupled to the second I/O-integrated-circuit connector pads; and an optical integrated circuit having a top surface, facing the front surface of the I/O integrated circuit, with optical-integrated-circuit connector pads electrically coupled to the optical-integrated-circuit electrical connectors, where the optical integrated circuit communicates optical signals.

Note that the integrated circuit may be adjacent to the I/O integrated circuit.

Moreover, the interposer may include: third interposer connector pads disposed on a bottom surface on an opposite side of the interposer from the top surface; and through-substrate vias (TSVs) electrically coupling the first interposer connector pads to the third interposer connector pads, and the second interposer connector pads to the third interposer connector pads. These TSVs may convey power and ground to the integrated circuit and the I/O integrated circuit. Furthermore, the chip package may include substrate electrical connectors electrically coupled to the third interposer connector pads; and a substrate having a front surface electrically coupled to the substrate electrical connectors.

In some embodiments, the chip package includes a ramp-stack chip package electrically coupled to a back surface on an opposite side of the substrate from the top surface, where the ramp-stack chip package includes multiple parallel substrates arranged at an oblique angle relative to the back surface.

Furthermore, a back surface of the optical integrated circuit on an opposite side of the optical integrated circuit from the top surface of the optical integrated circuit may be coupled to the front surface of the substrate.

In some embodiments, the chip package includes a second interposer between the front surface of the substrate and the bottom surface of the interposer.

Additionally, the chip package may include an optical fiber edge coupled to the optical integrated circuit and/or vertically coupled to the optical integrated circuit. For example, the optical fiber may be coupled to the front surface of the optical integrated circuit and/or a back surface of the optical integrated circuit on an opposite side of the optical integrated circuit from the front surface of the optical integrated circuit.

Note that the chip package may include an optical source optically coupled to the optical integrated circuit.

Moreover, the interposer may include: a ceramic, an organic material, a glass, and/or a semiconductor.

In some embodiments, the chip package includes a thermal-cooling mechanism on a back surface of the integrated circuit on an opposite side of the integrated circuit from the front surface of the integrated circuit.

Another embodiment provides a system that includes a processor, a memory coupled to the processor and the chip package.

Another embodiment provides a method for communicating electrical signals between the integrated circuit and the optical integrated circuit. During the method, the electrical signals are coupled from the integrated-circuit connector pads on the front surface of the integrated circuit to the first interposer connector pads on the top surface of the interposer via the integrated-circuit electrical connectors, where the front surface faces the top surface. Then, the electrical signals are conveyed via traces disposed on the interposer, where the traces electrically couple the first interposer connector pads and the second interposer connector pads on the top surface. Moreover, the electrical signals are coupled from the second interposer connector pads to the first I/O-integrated-circuit connector pads on the front surface of the I/O integrated circuit via the I/O-integrated-circuit electrical connectors. Furthermore, the electrical signals are conveyed via traces disposed on the I/O integrated circuit, where the traces electrically couple the first I/O-integrated-circuit connector pads and the second I/O-integrated-circuit connector pads on the front surface. Next, the electrical signals are coupled from the second I/O-integrated-circuit connector pads to the optical-integrated-circuit connector pads on the top surface of the optical integrated circuit via the optical-integrated-circuit electrical connectors.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Embodiments of a chip package, a system that includes the chip package, and a technique for communicating electrical signals between an integrated circuit and an optical integrated circuit in the chip package are described. This chip package includes an optical integrated circuit (such as a hybrid integrated circuit) and an integrated circuit that are proximate to each other in the chip package. The integrated circuit includes electrical circuits, such as memory or a processor, and the optical integrated circuit communicates optical signals with very high bandwidth. Moreover, a front surface of the integrated circuit is electrically coupled to a top surface of an interposer, and this top surface is in turn electrically coupled to a front surface of an input/output (I/O) integrated circuit that faces the top surface. Furthermore, the front surface of the I/O integrated circuit is electrically coupled to a top surface of the optical integrated circuit, where the top surface of the optical integrated circuit faces the front surface of the I/O integrated circuit.

By integrating the optical integrated circuit and the integrated circuit in close proximity, the chip package may facilitate improved performance compared to chip packages with electrical interconnects. In particular, the chip package may provide multi-terabit per second optical communication in conjunction with high-performance electrical circuits by using a high-trace density interposer to indirectly electrically couple the integrated circuit and the optical integrated circuit. In this way, the chip package may meet the escalating demands of off-chip bandwidth, while providing higher bandwidth density and improved energy efficiency compared to electrical interconnects.

We now describe the chip package. Hybrid integration is a pragmatic approach that allows silicon photonic devices and VLSI circuits to be combined. The chip package described here contains hybrid-integrated electronic-photonic elements, where the electronics and photonics have been built on individually optimized technology platforms and then bonded together using a low-parasitic flip-chip-assembly technique, such as thermocompression or reflow bonding.

Figure 1:
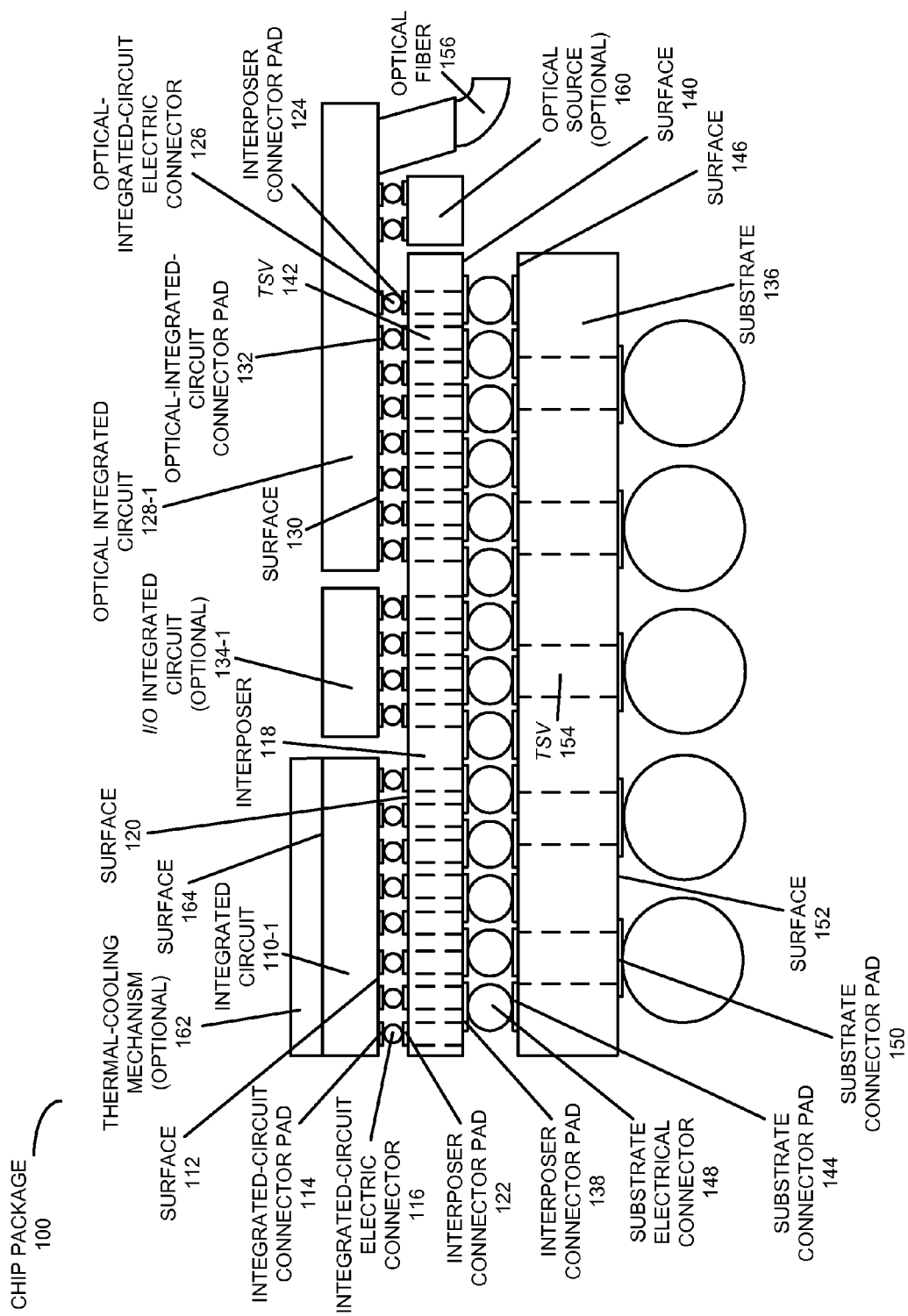
FIG. 1 is a block diagram illustrating a side view of a chip package in accordance with an embodiment of the present disclosure.

FIG. 1 presents a block diagram illustrating a side view of a chip package 100, such as a wavelength-division-multiplexing photonic input/output (I/O)-enabled hybrid-integrated chip package. In chip package 100, integrated circuit 110-1 (such as a switch chip or a high-performance processor that requires ultrahigh off-chip bandwidth, and which is sometimes referred to as a 'payload IC') may be flip-chip bonded to interposer 118. In particular, chip package 100 includes: integrated circuit 110-1 having a surface 112 with integrated-circuit connector pads (such as integrated-circuit connector pad 114); integrated-circuit electrical connectors (such as integrated-circuit electrical connector 116) electrically coupled to the integrated-circuit connector pads; an interposer 118 having a surface 120, facing surface 112, with first interposer connector pads (such as interposer connector pad 122) electrically coupled to the integrated-circuit electrical connectors, and second interposer connector pads (such as interposer connector pad 124); and optical-integrated-circuit electrical connectors (such as optical-integrated-circuit electrical connector 126) electrically coupled to the second interposer connector pads.

For example, interposer 118 may include: a ceramic, an organic material, a glass, and/or a semiconductor (such as silicon or silicon-on-insulator). In general, interposer 118 may have a coefficient of thermal expansion very close to silicon. This may provide thermo-mechanical latitude to use shorter and higher density bumps on chips, but also to bond chips very close together. In an exemplary embodiment, interposer 118 has a thickness between 100 μm and 1 mm.

Moreover, chip package 100 includes an optical integrated circuit 128-1 (which is sometimes referred to as a 'photonic bridge chip' or a 'photonic IC') having a surface 130, facing surface 120, with optical-integrated-circuit connector pads (such as optical-integrated-circuit connector pad 132) electrically coupled to the optical-integrated-circuit electrical connectors, where optical integrated circuit 128-1 is proximate to integrated circuit 110-1 on a same side of interposer 118, and optical integrated circuit 128-1 communicates optical signals. In some embodiments, optical integrated circuit 128-1 is adjacent to integrated circuit 110-1. In an exemplary embodiment, optical integrated circuit 128-1 is fabricated on a silicon-on-insulator substrate and includes optical components, such as optical waveguides, modulators, and photodetectors.

Furthermore, chip package 100 may include an optional I/O integrated circuit 134-1 between integrated circuit 110-1 and optical integrated circuit 128-1, where optional I/O integrated circuit 134-1 is coupled to optical integrated circuit 128-1 via interposer 118. For example, optional I/O integrated circuit 134-1 may be bonded as close as 10 μm from integrated circuit 110-1 and as close as possible to optical integrated circuit 128-1. Note that optional I/O integrated circuit 134-1 may serialize/deserialize data in the electrical signals. In addition to serializing/deserializing data, optional I/O integrated circuit 134-1 may include energy-efficient photonic driver and receiver circuits. Thus, optional I/O integrated circuit 134-1 may accept parallel data from integrated circuit 110-1, serialize the data and encode the data onto a photonic-modulator driver signal. Conversely, optional I/O integrated circuit 134-1 may accept serial electrical data from the photodetectors on optical integrated circuit 128-1, and may convert the electrical data into parallel inputs to transmit electrically to integrated circuit 110-1. In some embodiments, the integrated circuit—I/O integrated circuit interface consists of multiple moderate-speed electrical links (e.g., 1-5 Gbps per channel), whereas the I/O integrated circuit-optical integrated circuit interface may include a smaller number of high-speed serial links (e.g., greater than 14 Gbps per channel). Thus, optional I/O integrated circuit 134-1 may combine parallel channels to make the best use of the optical communication provided by optical integrated circuit 128-1. This combination may involve changing the communication-protocol format of data in the communicated electrical signals.

Note that optical integrated circuit 128-1 may be hybrid integrated onto interposer 118. This hybrid integration may be achieved using a flip-chip attachment technique using thermocompression or reflow-bonded microbump technology. The bump and hybrid bond-pad sizes may be designed to minimize parasitic capacitance. For example, optional VLSI I/O integrated circuit 134-1 may be surrounded by a field of C4-type solder interconnects (e.g., C4 bumps, lead-free bumps, copper-pillar bumps, etc.). Alternatively, compliant, rematable interconnects may be used instead of C4-type interconnects. This may facilitate rework and/or higher yield. After testing, a temporary connection may be made permanent using a low-temperature solder and/or an adhesive underfill.

Moreover, hybrid-integrated optical integrated circuit 128-1 may be flip-chip attached to interposer 118 with a small or minimal gap between the two to minimize the electrical chip-to-chip interconnect wire length. Integrated circuit 110-1 may also be flip-chip attached to interposer 118. In general, the density of flip-chip interconnects may ultimately be constrained by physical limitations in the package-substrate manufacturing process.

Furthermore, chip package 100 may include substrate 136 (such as a printed-circuit board, a ceramic, an organic, and/or glass), which may provide a backplane with power, ground, control, monitoring, etc. Interposer 118 may include third interposer connector pads (such as interposer connector pad 138) on surface 140 of interposer 118 (which is on an opposite side of interposer 118 from surface 120). These third interposer connector pads may be electrically coupled to the first interposer connector pads and the second interposer connector pads by through-substrate vias or TSVs (or through-glass vias if interposer 118 includes glass), such as TSV 142. These TSVs may have widths of 50-200 μm. Note that the third interposer connector pads may have a lower pitch than a pitch of the first interposer connector pads and/or a pitch of the second interposer connector pads. Thus, interposer 118 may facilitate a physical transformation of pad/bump pitch between the two sides of interposer 118. Moreover, the third interposer connector pads may be electrically coupled to first substrate connector pads (such as substrate connector pad 144) on surface 146 of substrate 136 by substrate electrical connectors (such as substrate electrical connector 148).

Furthermore, substrate 136 may include second substrate connector pads (such as substrate connector pad 150) on surface 152 (which is on an opposite side of substrate 136 from surface 146), which are electrically coupled to the first substrate connector pads by TSVs, such as TSV 154. In addition, substrate 136 may include multiple layers of wiring on surfaces 146 and 152 for signal and power ground routing, as well as redistribution. Therefore, the TSV in substrate 136 may convey power and ground, via interposer 118, to integrated circuit 110-1, optional I/O integrated circuit 134-1 and optical integrated circuit 128-1.

During operation, integrated circuit 110-1 may communicate with optional I/O integrated circuit 134-1 via wiring on interposer 118, and with optical integrated circuit 128-1 via wiring on interposer 118 (without passing through the TSVs in interposer 118). To facilitate this communication, interposer 118 may include dense redistribution wiring layers on surfaces 120 and/or 140. Moreover, the electrical signals may also traverse up to four off-chip interconnects. Thus, the electrical signals may go from: integrated circuit 110-1 to interposer 118 via the integrated-circuit electrical connectors; interposer 118 to optional I/O integrated circuit 134-1 via electrical connectors; optional I/O integrated circuit 134-1 to interposer 118 via additional electrical connectors; and from interposer 118 to optical integrated circuit 128-1 via the optical-integrated-circuit electrical connectors. While this communication may involve a large number of moderate-speed rated off-chip interconnects on integrated circuit 110-1 and optional I/O integrated circuit 134-1, this configuration minimizes the wire-length of ultrahigh speed electrical signals between optional I/O integrated circuit 134-1 and optical integrated circuit 128-1, where the optional I/O integrated circuit 134-1 may contain serializer/deserializer functionality.

A portion of optical integrated circuit 128-1 may extend beyond an edge of interposer 118. As shown in FIG. 1, and described further below with reference to FIGS. 2-4, this so-called 'diving-board' configuration may provide easy access and physical space for attachment (using an optical coupler) of at least one optical fiber 156 to optical integrated circuit 128-1 (more may be used depending on the bandwidth requirements). This optical fiber may carry high-speed optical signals to and from chip package 100.

Figure 2:
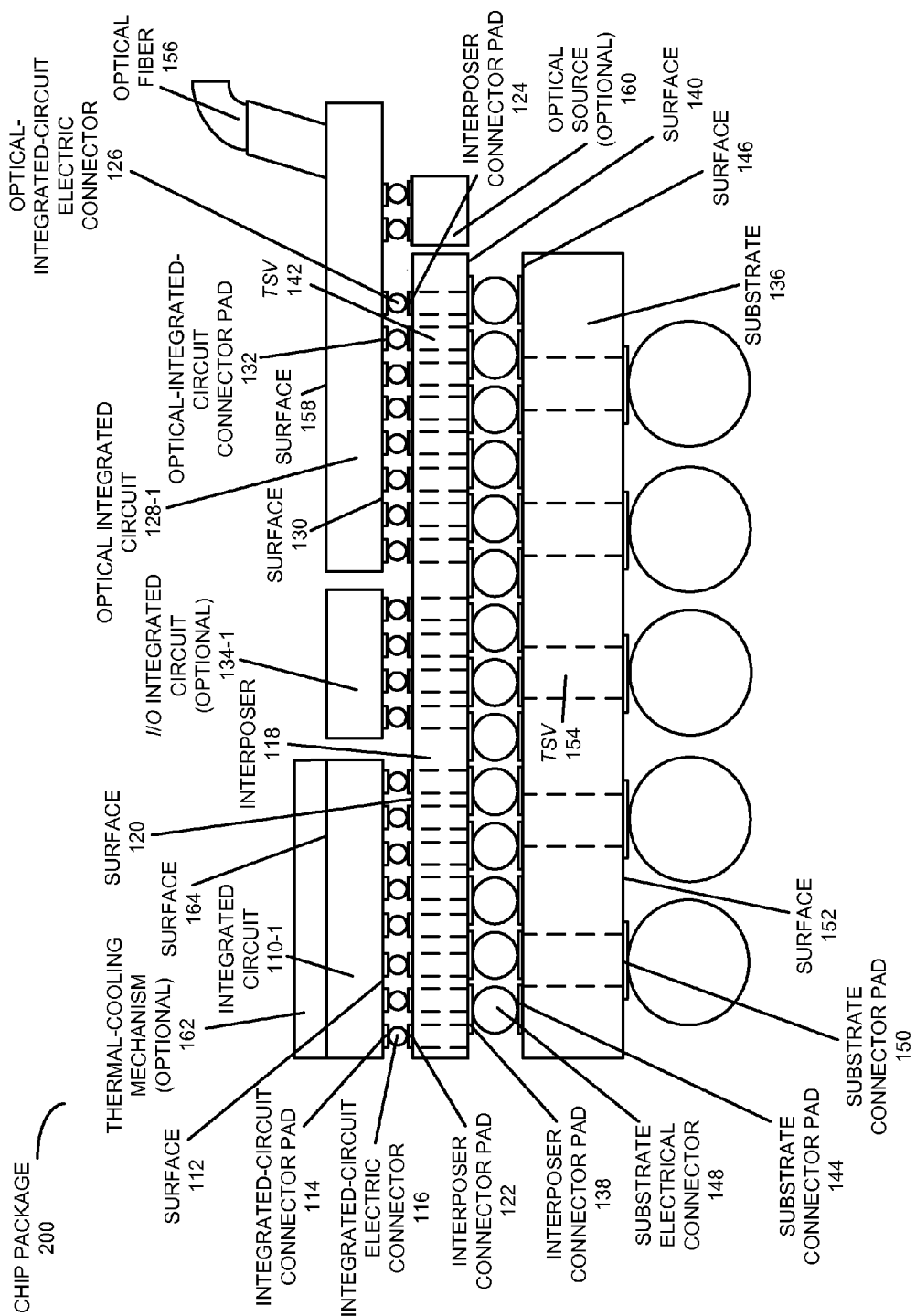
FIG. 2 is a block diagram illustrating a side view of a chip package in accordance with an embodiment of the present disclosure.

In particular, optical fiber 156 may be vertically coupled to surface 130 of optical integrated circuit 128-1. Alternatively, as shown in FIG. 2, which presents a block diagram illustrating a side view of a chip package 200, optical fiber 156 may be vertically coupled to surface 158 of optical integrated circuit 128-1 on the opposite side of optical integrated circuit 128-1 from surface 130.

Figure 3:
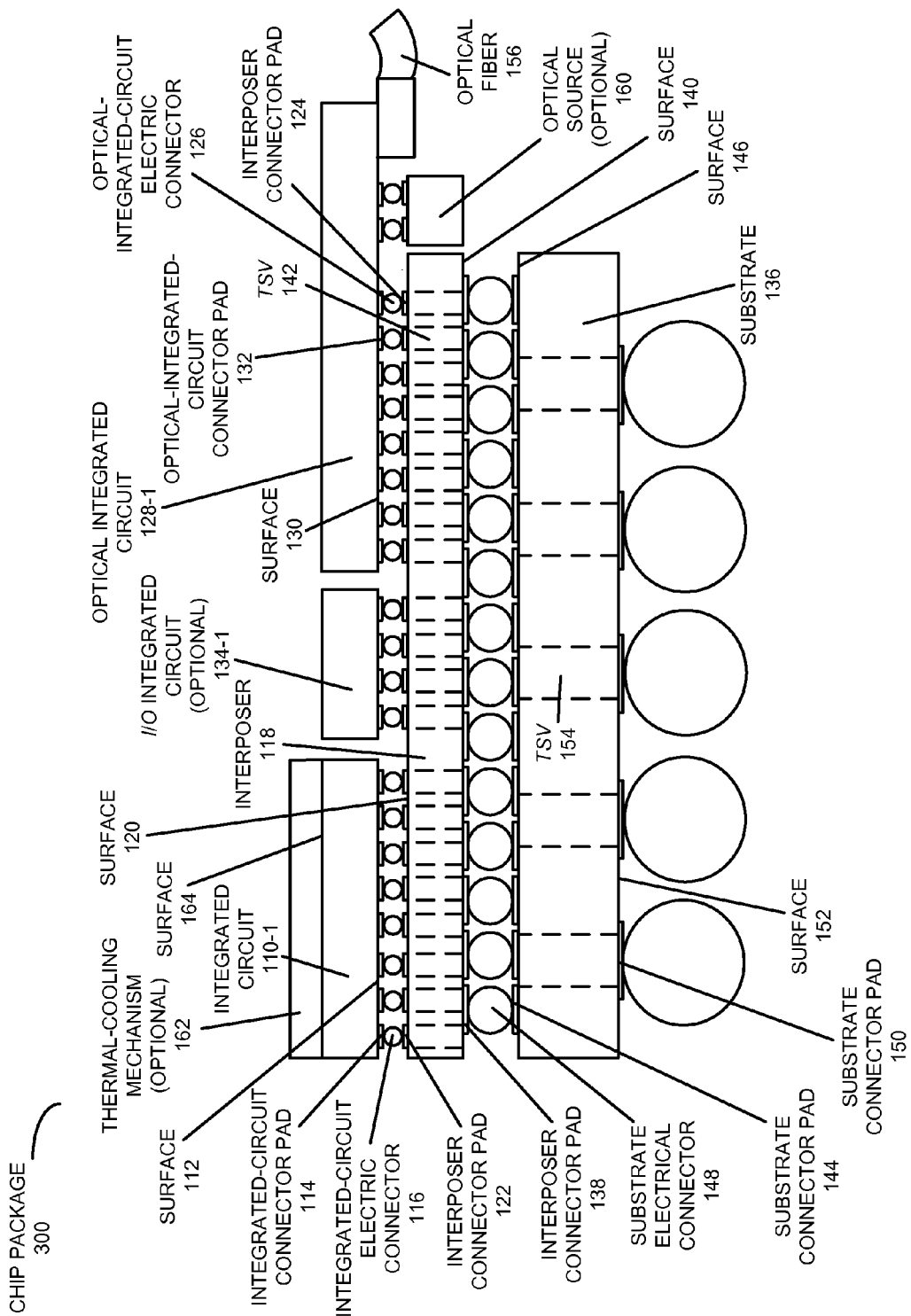
FIG. 3 is a block diagram illustrating a side view of a chip package in accordance with an embodiment of the present disclosure.
Figure 4:
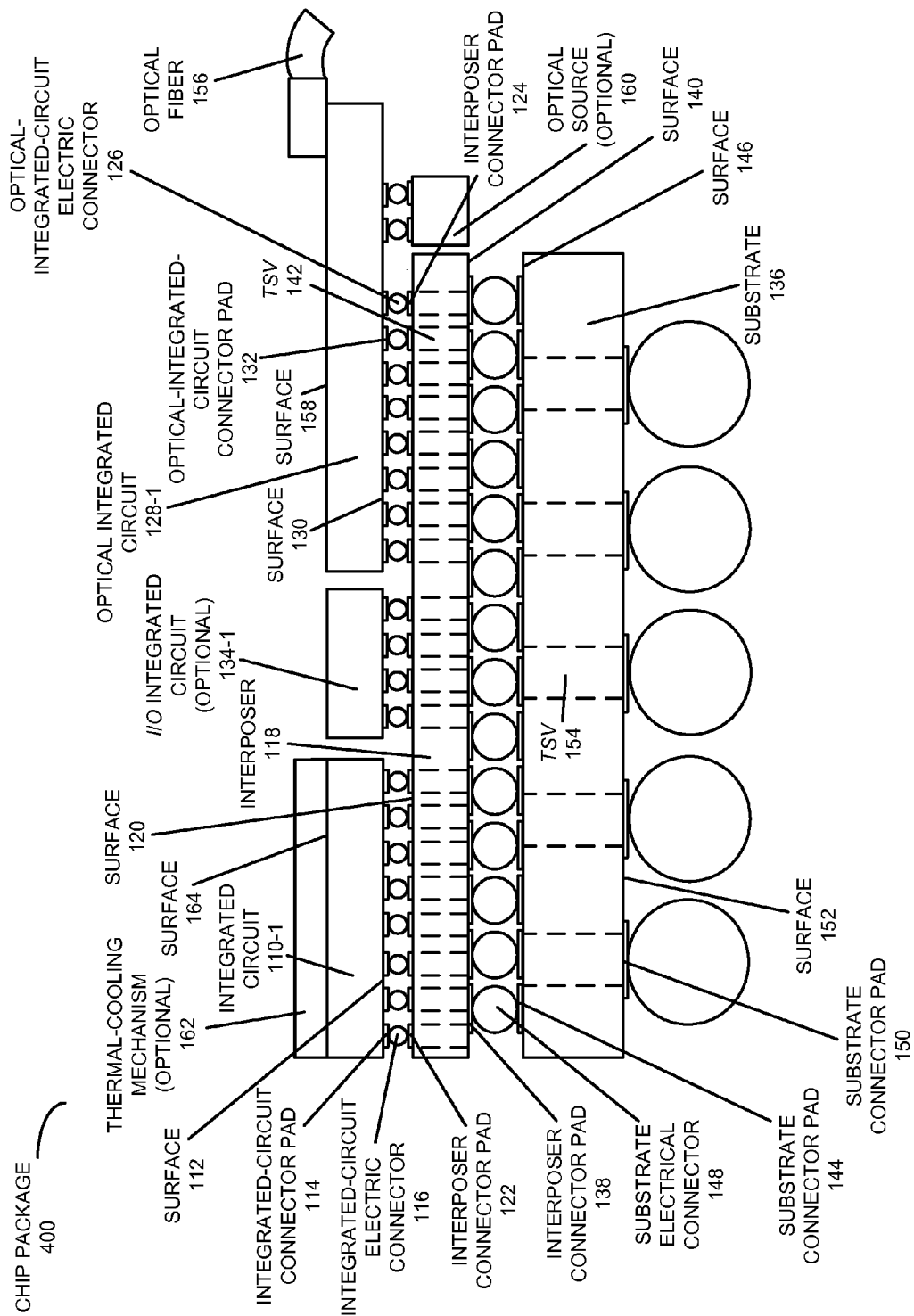
FIG. 4 is a block diagram illustrating a side view of a chip package in accordance with an embodiment of the present disclosure.

In some embodiments, optical fiber 156 is edge coupled to optical integrated circuit 128-1. For example, as shown in FIG. 3, which presents a block diagram illustrating a side view of a chip package 300, optical fiber 156 may be edge coupled to surface 130 of optical integrated circuit 128-1 and/or optical fiber 156 may be edge coupled to surface 158. This later configuration is shown in FIG. 4, which presents a block diagram illustrating a side view of a chip package 400.

When optical fiber 156 is edge coupled to surface 130 or edge or vertically coupled to surface 158, optical integrated circuit 128-1 may include additional elements, such as mirrors, and/or lenses. In the latter two cases, the optical integrated circuit 128-1 may also include through optical vias (with or without an optically transmissive material); this configuration may leave surface 130 clear for interposer 118 and underfill, and in addition, optical integrated circuit 128-1 and optical fiber 156 may not have to be pre-assembled.

Optical fiber 156 (or another dedicated optical fiber) may be used to bring in light from an off-package optical source (e.g., one or more lasers). Alternatively, as shown in FIG. 1, an optional optical source 160 may be included on optical integrated circuit 128-1. For example, optional optical source 160 may be optically coupled to surface 130 of optical integrated circuit 128-1.

In some embodiments, chip package 100 includes an optional thermal-cooling mechanism 162 on a surface 164 of integrated circuit 110-1 on an opposite side of integrated circuit 110-1 from surface 112. This optional thermal-cooling mechanism may include a heat sink. Moreover, the heat sink may extend beyond integrated circuit 110-1 to interface other chips on chip-package 100. In addition, it may have some topology if the chips have different heights. If optical fiber 156 interfaces with surface 158, it may share space with optional thermal-cooling mechanism 162 (such as a heat sink with or without a lid, e.g., copper, aluminum silicon carbide, etc.). In addition, in embodiments with optional optical source 160, chip package 100 may include an appropriate thermal-management technique for optional optical source 160.

Figure 5:
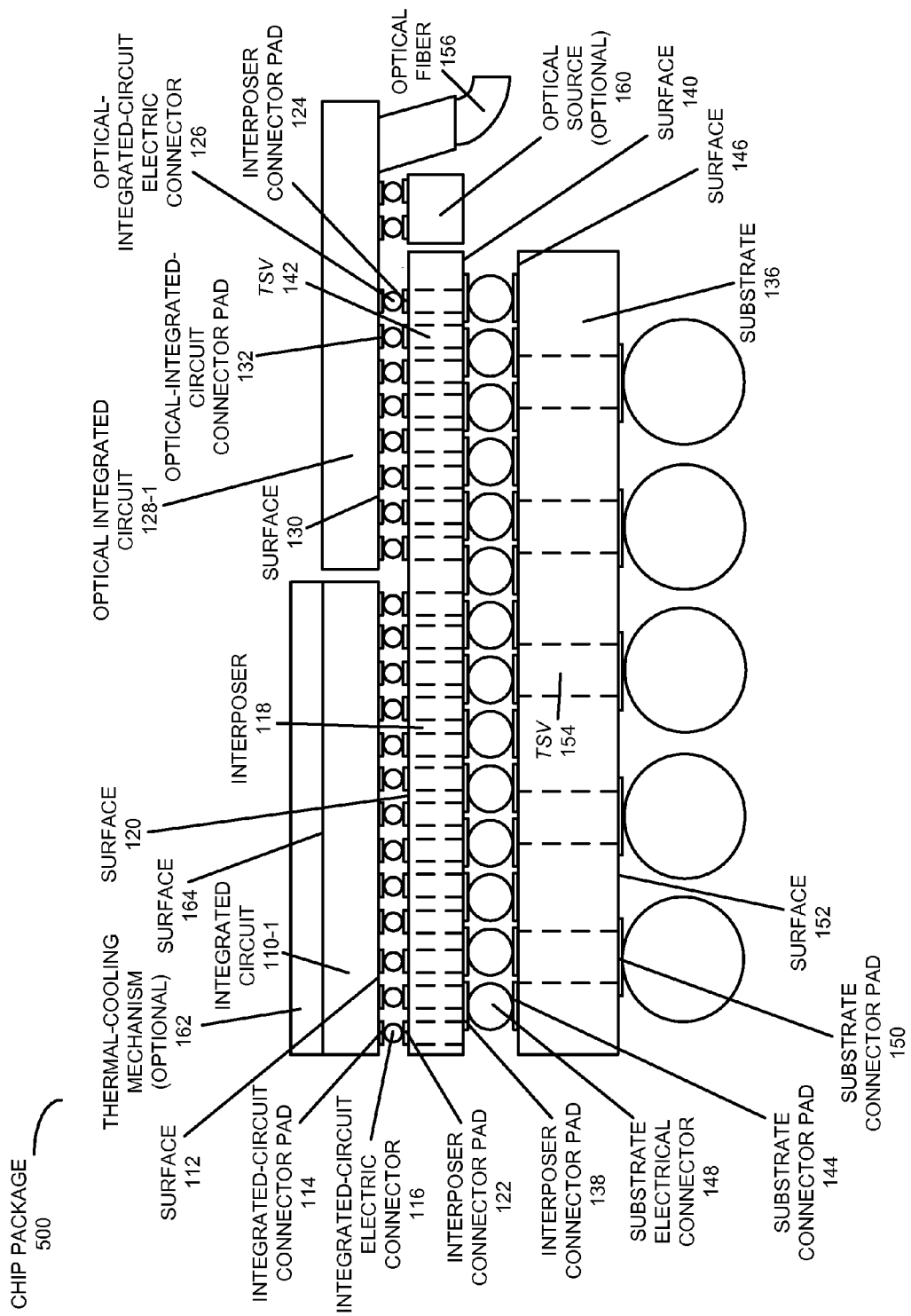
FIG. 5 is a block diagram illustrating a side view of a chip package in accordance with an embodiment of the present disclosure.

As noted previously, in some embodiments, optional I/O integrated circuit 134-1 is included in integrated circuit 110-1. This is shown in FIG. 5, which presents a block diagram of chip package 500. In chip package 500, integrated circuit 110-1 is capable of directly communicating electrical signals with optical integrated circuit 128-1.

Referring back to FIG. 1, in an exemplary embodiment the chip package is assembled by attaching optional optical source 160 using hybrid-bonding or a fusion-bonding process. Then, integrated circuit 110-1, optical integrated circuit 128-1, and optional I/O integrated circuit 134-1 may be integrated using fine-pitch microbumps. Moreover, integrated circuit 110-1, optical integrated circuit 128-1, and optional I/O integrated circuit 134-1 may be coupled to substrate 136 using C4-type interconnects. Furthermore, ball-grid-array interconnects may be coupled to surface 152 so substrate 136 can be attached to a printed-circuit board. Additionally, optical fiber 156 may be optically coupled to optical integrated circuit 128-1.

Figure 6:
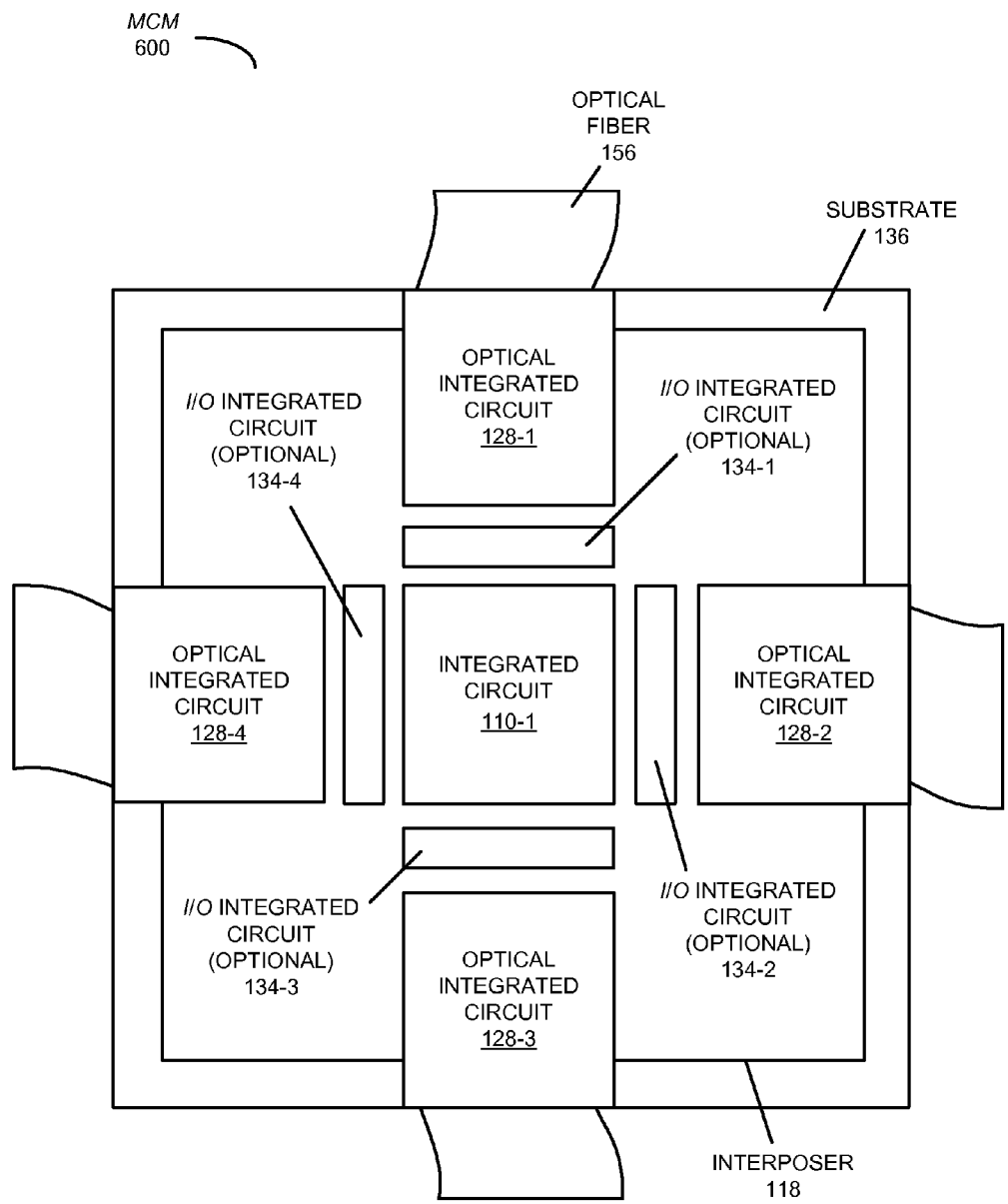
FIG. 6 is a block diagram illustrating a top view of a multi-chip module (MCM) in accordance with an embodiment of the present disclosure.

In order to maximize the number of off-chip data channels, and therefore the bandwidth, multiple optical integrated circuits 128 may be placed adjacent to multiple optional I/O integrated circuits 134. This is illustrated in FIG. 6, which presents a block diagram illustrating a top view of a multi-chip module (MCM) 600.

Figure 7:
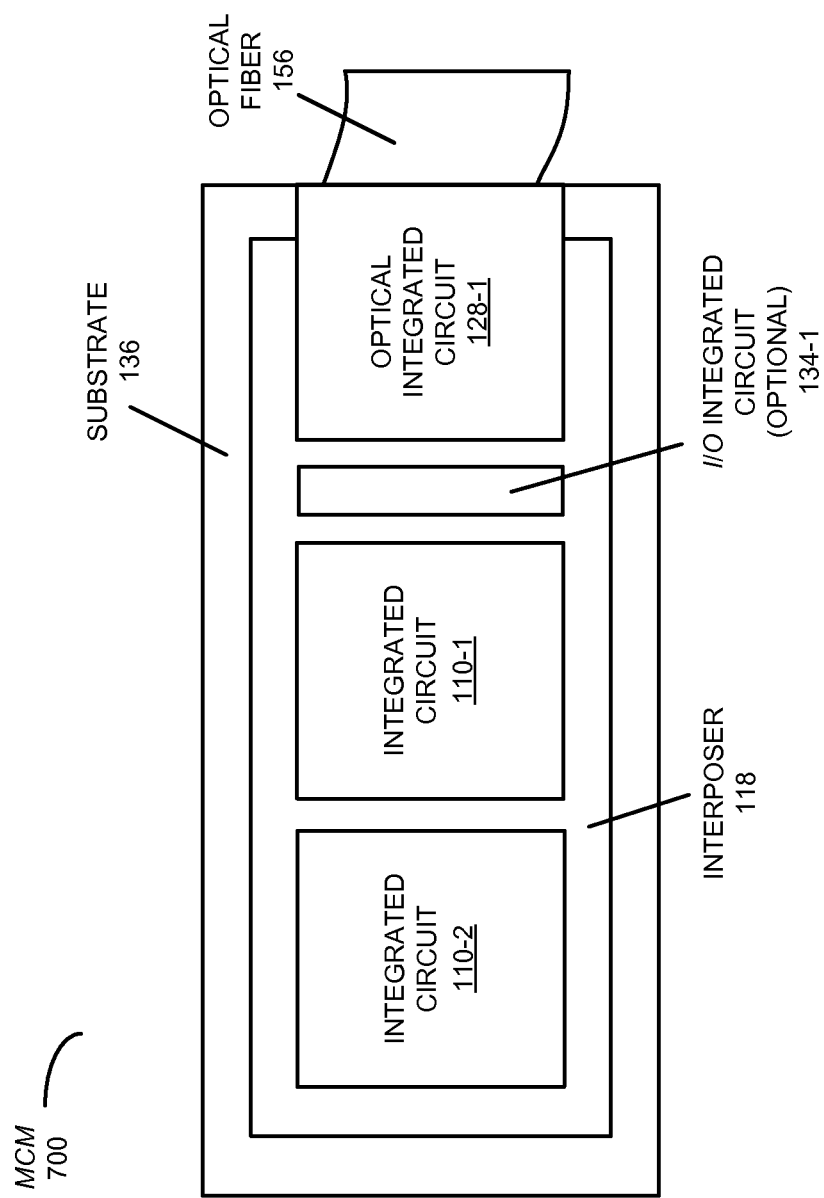
FIG. 7 is a block diagram illustrating a top view of an MCM in accordance with an embodiment of the present disclosure.
Figure 8:
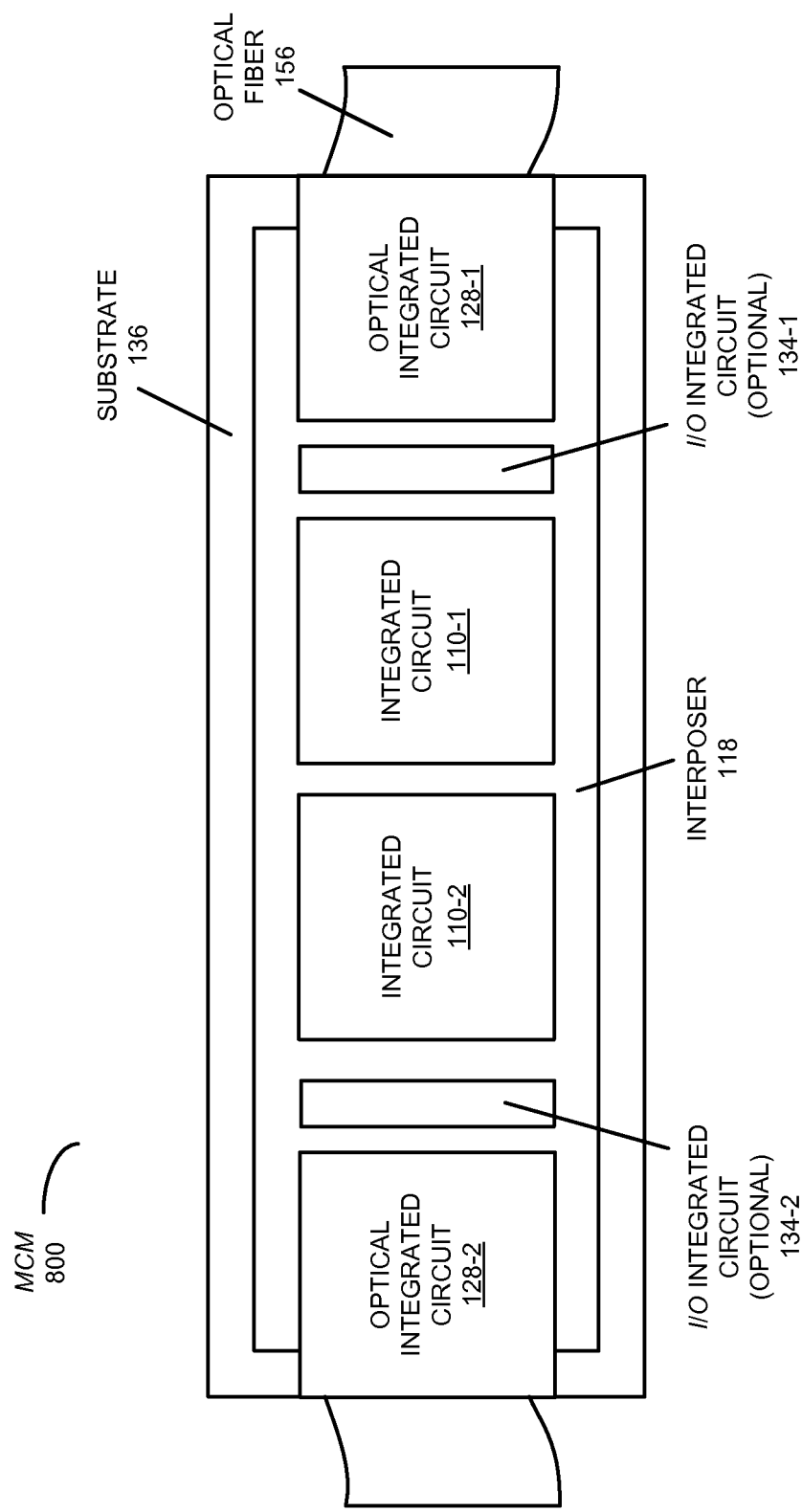
FIG. 8 is a block diagram illustrating a top view of an MCM in accordance with an embodiment of the present disclosure.

As shown in FIGS. 7 and 8, which present block diagrams illustrating top views of MCMs 700 and 800, the computing performance and I/O bandwidth may be increased by including additional instances of the integrated circuit. In these embodiments, the electrical signals may be routed between the chips using interposer 118.

Figure 9:
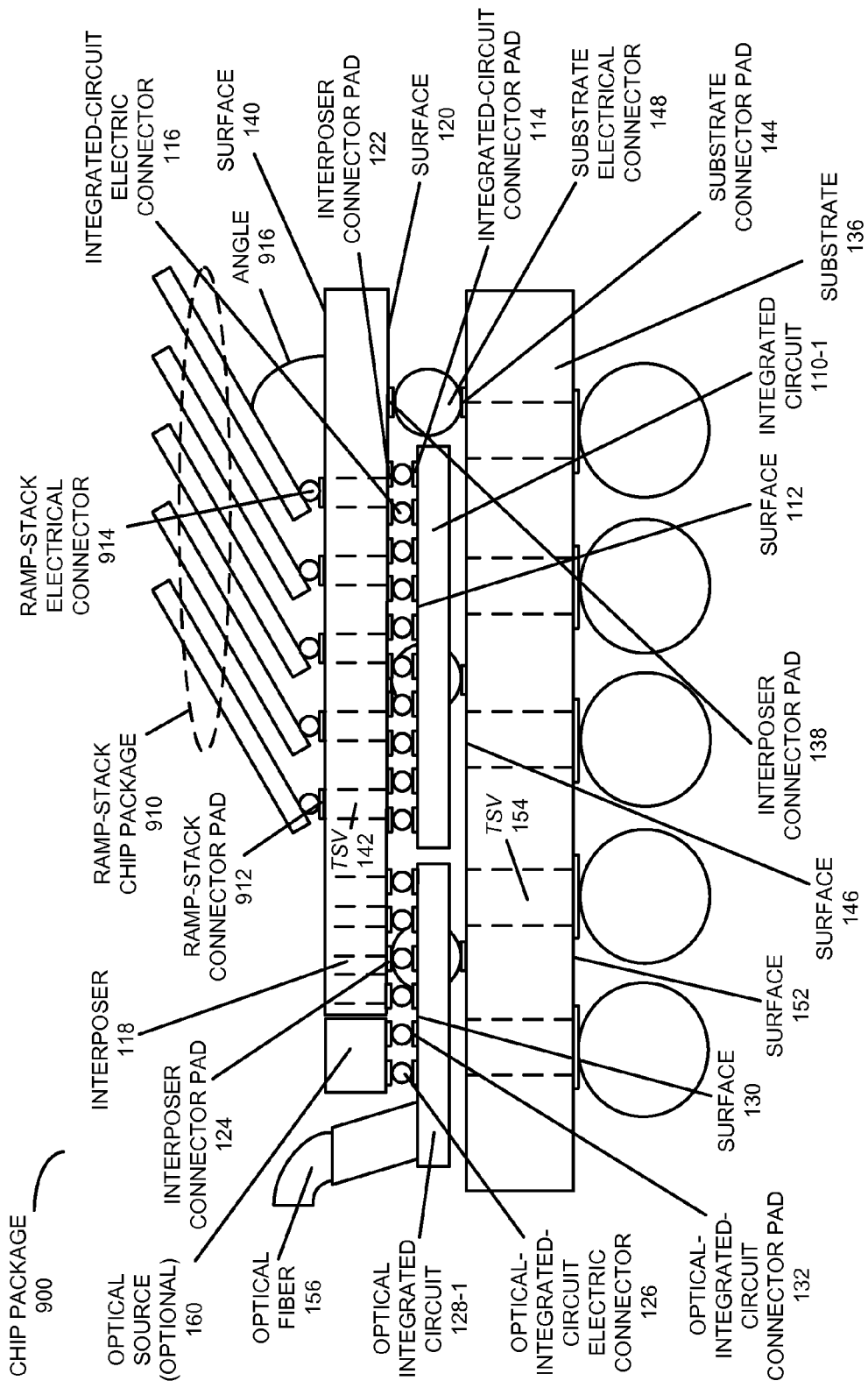
FIG. 9 is a block diagram illustrating a side view of a chip package in accordance with an embodiment of the present disclosure.

In some embodiments, the chip package includes low-latency, high-bandwidth interconnections to banks of high-density memory. This is shown in FIG. 9, which presents a block diagram illustrating a side view of a chip package 900 that includes a ramp-stack chip package 910 electrically coupled to ramp-stack connector pads (such as ramp-stack connector pad 912) by ramp-stack electrical connectors (such as ramp-stack electrical connector 914), where ramp-stack chip package 910 includes multiple parallel substrates arranged at an oblique angle 916 relative to surface 140. (For example, there may be as many as 80 substrates in ramp-stack chip package 910.) Moreover, the third interposer connector pads may have a lower pitch than a pitch of the first interposer connector pads and/or a pitch of the second interposer connector pads. Furthermore, integrated circuit 110-1 may be coupled to ramp-stack chip package 910 by the TSVs in interposer 118 and flip-chip interconnects.

Ramp-stack chip package 910 may increase memory and interconnect capacity in chip package 900. While ramp-stack chip package 910 is used as an illustration in FIG. 9, in other embodiments memory stacks fabricated using other techniques, such as stacked with TSVs or assembled as vertical chips, are used. Furthermore, multiple memory stacks may be coupled to interposer 118 to further increase the memory and interconnect capacity.

Note that optical integrated circuit 128-1 may include wavelength-division-multiplexing optical devices, and integrated circuit 110-1 may include optical-device driver and receiver circuits, as well as memory-controller circuitry. Moreover, chip package 900 may be constructed such that there is a point-to-point relationship between memory-control POs on integrated circuit 110-1 and POs of memory chips in ramp-stack chip package 910. Furthermore, optical integrated circuit 128-1 and integrated circuit 110-1 may be bonded as close as possible to minimize wire length, and therefore electrical parasitics.

Additionally, interposer 118 may also include flip-chip interconnects to assemble the entire subcomponent onto a package substrate or printed-circuit board. Therefore, chips mounted on the same side as the flip-chip interconnects (C4, copper pillars, etc.) may need to be thinner than the height of these interconnects.

As shown in FIG. 9, surface 152 may include interconnects (such as a ball-grid array) for assembling chip package 900 onto a printed-circuit board. In some embodiments, ramp-stack chip package 910 and optical integrated circuit 128-1 are thermally managed from the top-side of chip package 900. For example, a thermal-interface material may contact a heat-spreading feature on the mating printed-circuit board.

Figure 10:
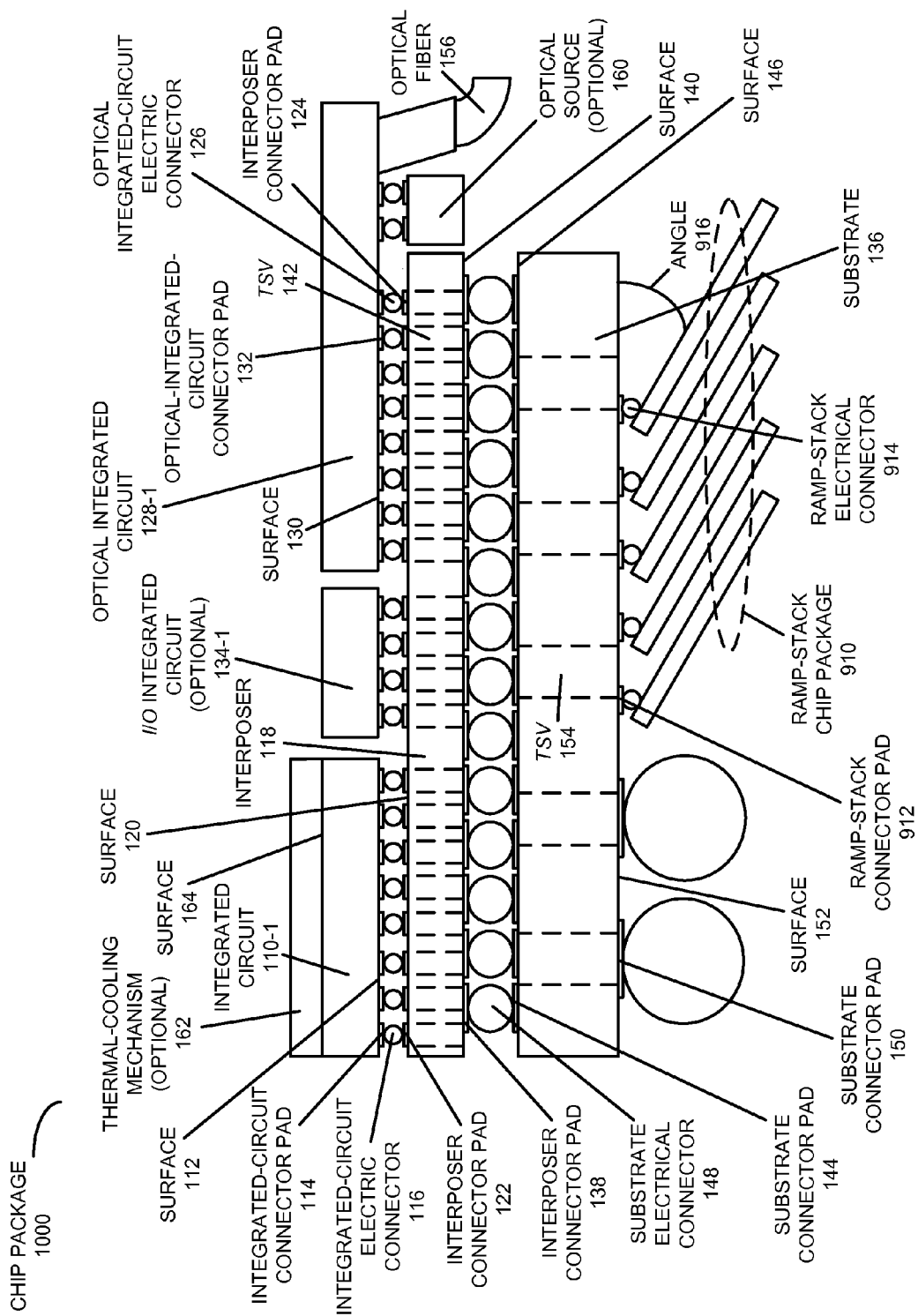
FIG. 10 is a block diagram illustrating a side view of a chip package in accordance with an embodiment of the present disclosure.

Alternatively, as shown in FIG. 10, which presents a block diagram illustrating a side view of chip package 1000, ramp-stack chip package 910 may be electrically coupled to surface 152. Once again, ramp-stack chip package 910 may include multiple parallel substrates arranged at an oblique angle 916 relative to surface 152. Straight-through TSVs in substrate 136 may interconnect the memory POs to memory controller POs on integrated circuit 110-1. Ramp-stack chip package 910 may be powered by chip package 1000 (e.g., via a ball-grid array).

Moreover, integrated circuit 110-1 may include high-speed drivers and receivers that communicate with the photonic devices on optical integrated circuit 128-1 via short interconnects on interposer 118. For example, the interconnects between integrated circuit 110-1 and optical integrated circuit 128-1 may operate at speeds up to and exceeding 25 Gbps. Note that the driver and receiver circuits may be lined up along the edge of integrated circuit 110-1 adjacent to optical integrated circuit 128-1. Similarly, photonic devices may be lined up along the edge of optical integrated circuit 128-1 adjacent to integrated circuit 110-1.

Figure 11:
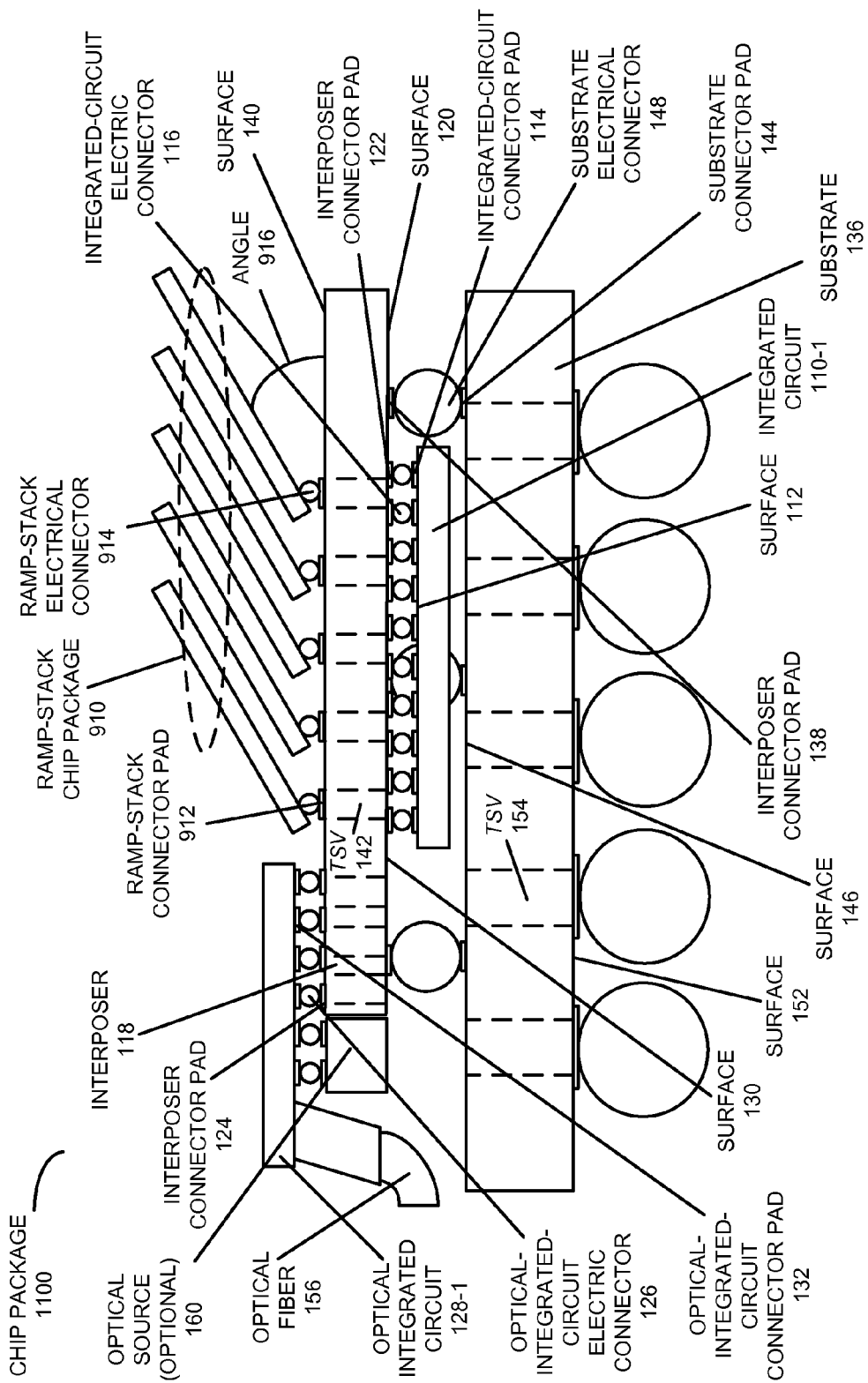
FIG. 11 is a block diagram illustrating a side view of a chip package in accordance with an embodiment of the present disclosure.

Another configuration is shown in FIG. 11, which presents a block diagram illustrating a side view of chip package 1100. In this embodiment, optical integrated circuit 128-1 and ramp-stack chip package 910 may be electrically coupled to surface 140 of interposer 118, while integrated circuit 110-1 and substrate 136 may be electrically coupled to surface 120. Therefore, integrated circuit 110-1 may be thinner than the height of the flip-chip interconnects (C4, copper pillars, etc.) used to electrically couple interposer 118 to substrate 136.

Figure 12:
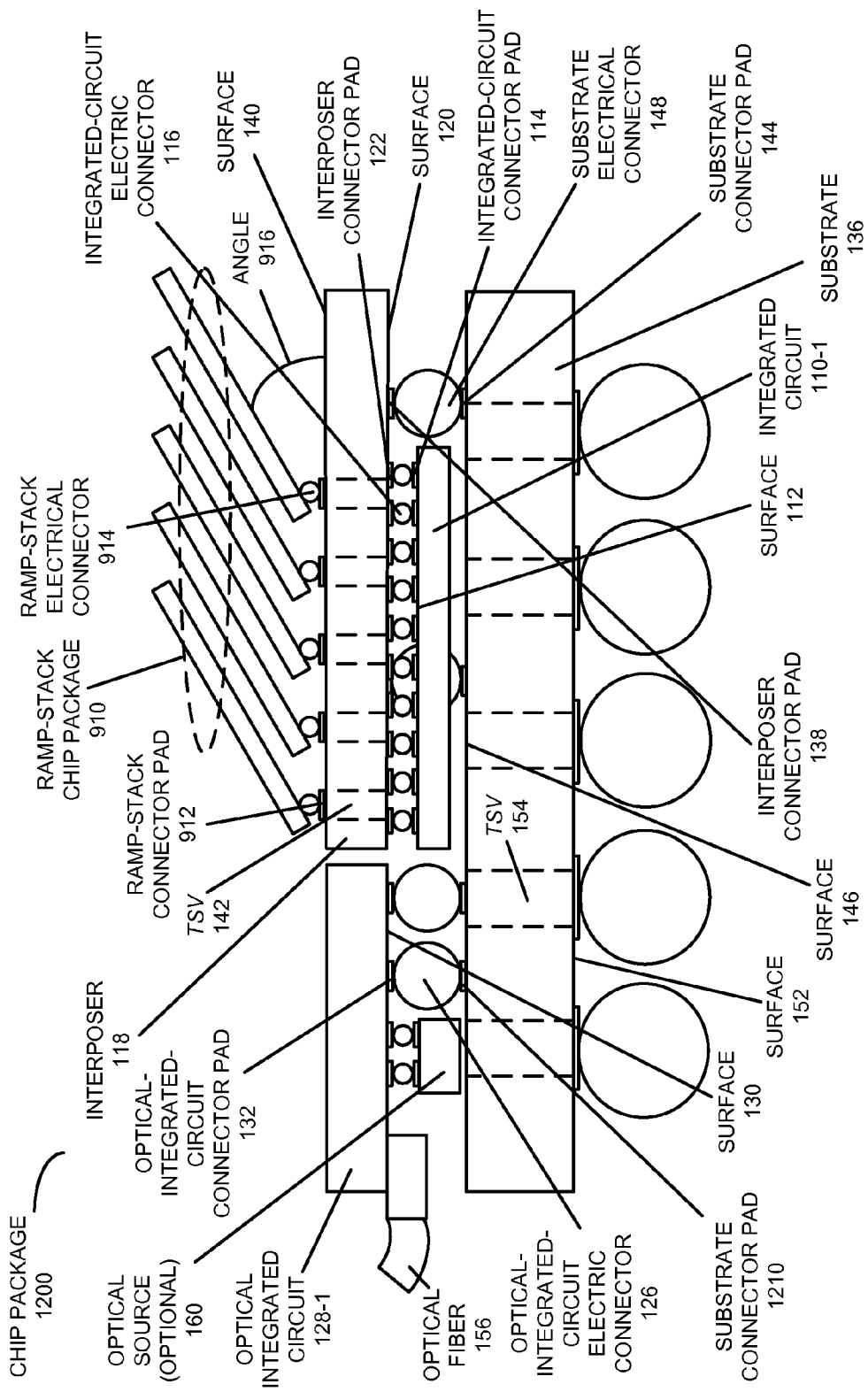
FIG. 12 is a block diagram illustrating a side view of a chip package in accordance with an embodiment of the present disclosure.

In another embodiment, shown in FIG. 12, which presents a block diagram illustrating a side view of a chip package 1200, ramp-stack chip package 910 is electrically coupled to surface 140 of interposer 118, while integrated circuit 110-1 and substrate 136 are electrically coupled to surface 120. Once again, integrated circuit 110-1 may be thinner than the height of the flip-chip interconnects (C4, copper pillars, etc.) used to electrically couple interposer 118 to substrate 136. Furthermore, optical integrated circuit 128-1 may be adjacent to interposer 118 on substrate 136, and may be coupled to substrate 136 by the optical-integrated-circuit connector pads, the optical-integrated-circuit electrical connectors, and additional substrate connector pads (such as substrate connector pad 1210). Communication between integrated circuit 110-1 and optical integrated circuit 128-1 may be routed through interposer 118 and substrate 136.

Figure 13:
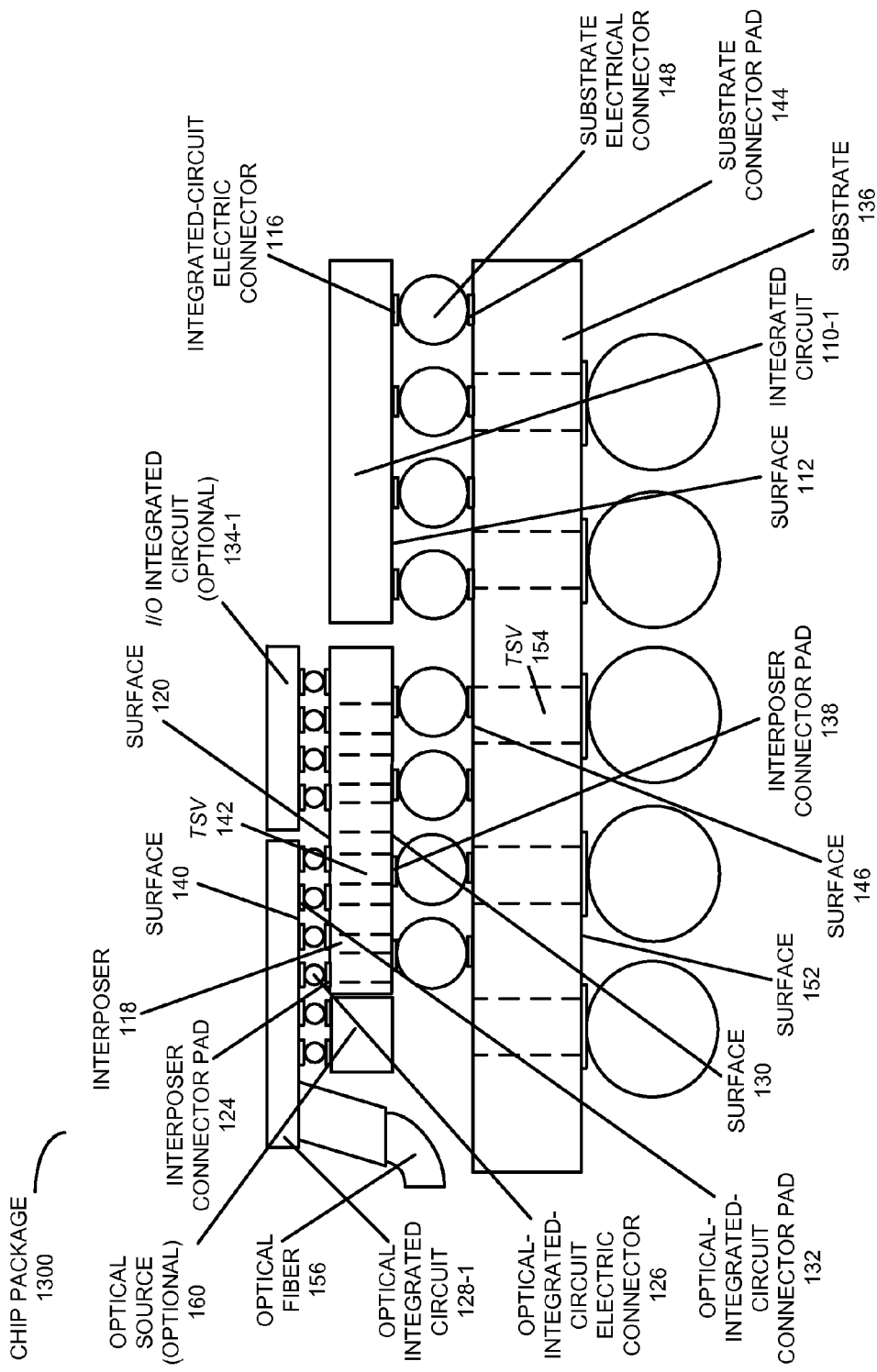
FIG. 13 is a block diagram illustrating a side view of a chip package in accordance with an embodiment of the present disclosure.

In another embodiment shown in FIG. 13, which presents a block diagram illustrating a side view of a chip package 1300, integrated circuit 110-1 may be electrically coupled to substrate 136, while optical integrated circuit 128-1 and optional I/O integrated circuit 134-1 may be electrically coupled to interposer 118 (which is electrically coupled to substrate 136). For example, integrated circuit 110-1 may be flip-chip attached to substrate 136 using C4-type bumps (such as C4 bumps, lead-free bumps, copper pillars, etc.), optical integrated circuit 128-1 and optional I/O integrated circuit 134-1 may be flip-chip attached to interposer 118 using high-density microbumps, and interposer 118 may be attached to substrate 136 using C4-type bumps. Note that optical integrated circuit 128-1 and optional I/O integrated circuit 134-1 may be as close as possible to each other (such as a distance of less than 10 μm) to reduce electrical parasitics. Furthermore, integrated circuit 110-1 may communicate electrical signals with optional I/O integrated circuit 134-1 via substrate 136 and interposer 118.

Figure 14:
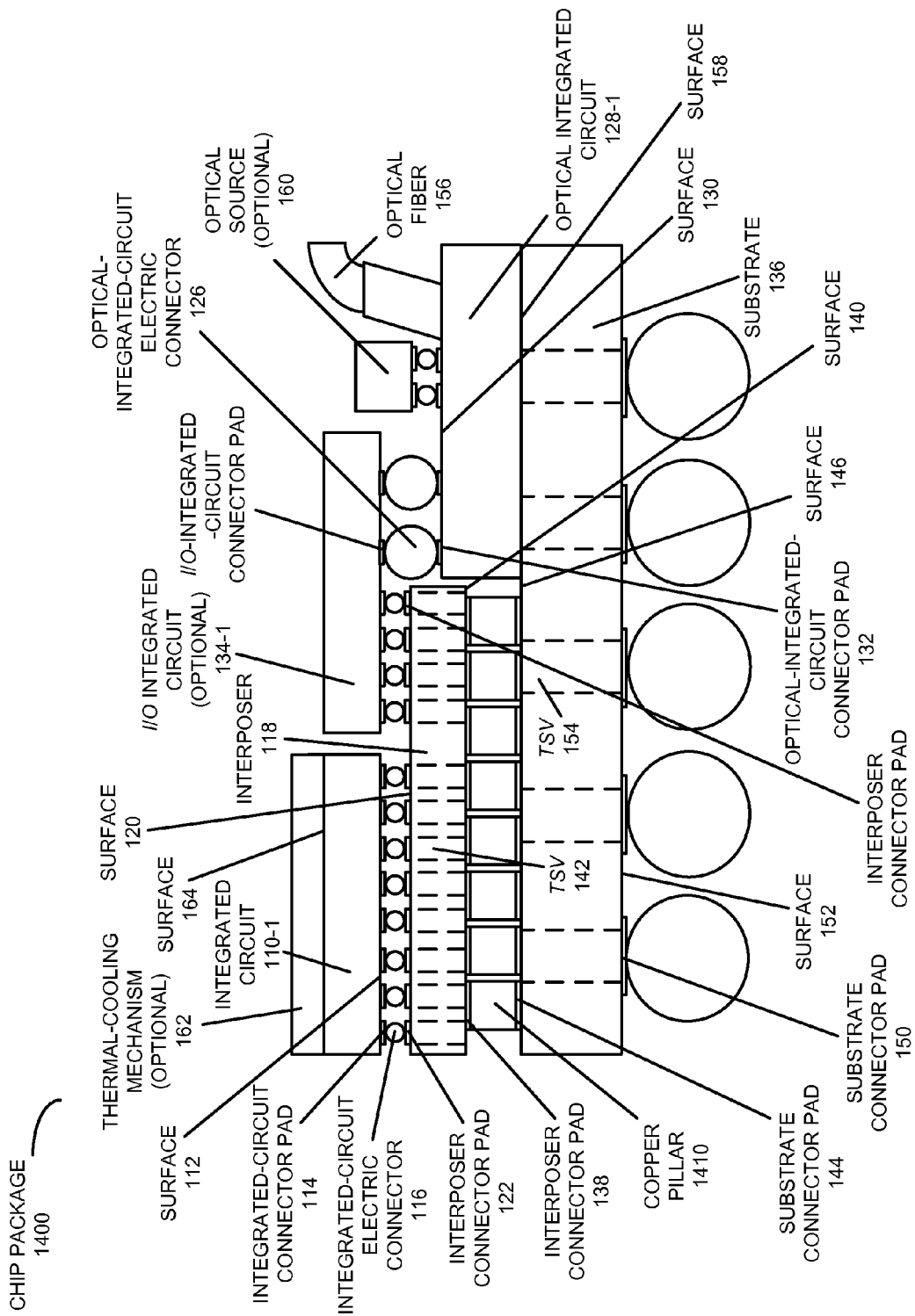
FIG. 14 is a block diagram illustrating a side view of a chip package in accordance with an embodiment of the present disclosure.

Another configuration is shown in FIG. 14, which presents a block diagram illustrating a side view of chip package 1400. In this chip package, integrated circuit 110-1 is coupled to interposer 118, and to substrate 136 by the TSVs in interposer 118. Moreover, optional I/O integrated circuit 134-1 is coupled to interposer 118, and optical integrated circuit 128-1 is coupled face-to-face to optional I/O integrated circuit 134-1. In addition, interposer 118 may be coupled to substrate 136 using copper pillars (such as copper pillar 1410). In some embodiments, another instance of the optional I/O integrated circuit (not shown) and the optical integrated circuit (not shown) is included in chip package 1400 on the left-hand side of integrated circuit 110-1, thereby providing a symmetric arrangement.

While optical integrated circuit 128-1 in FIG. 14 has the diving-board configuration, it is within the footprint of substrate 136. This may improve manufacturability and reliability. Because of the diving-board configuration, the thickness of the components may need to be selected carefully to prevent collision between optical integrated circuit 128-1 and substrate 136. In particular, the total height of the microbumps between optional I/O integrated circuit 134-1 and interposer 118, of interposer 118, and the C4-type bumps between interposer 118 and substrate 136 may need to be greater than the total height of the microbumps between optional I/O integrated circuit 134-1 and optical integrated circuit 128-1, and of optical integrated circuit 128-1. For example, the microbumps may have heights of approximately 5-50 μm, optional I/O integrated circuit 134-1 may have thicknesses of 150-300 μm, interposer 118 may have a thickness of 150 μm, and the C4-type bumps (such as copper pillars) may have heights of 50-100 μm.

Note that surface 158 may be coupled to surface 146. This coupling may be mechanical and/or thermal. In some embodiments, it does not include electrical coupling. However, in other embodiments the coupling may include electrical coupling.

Figure 15:
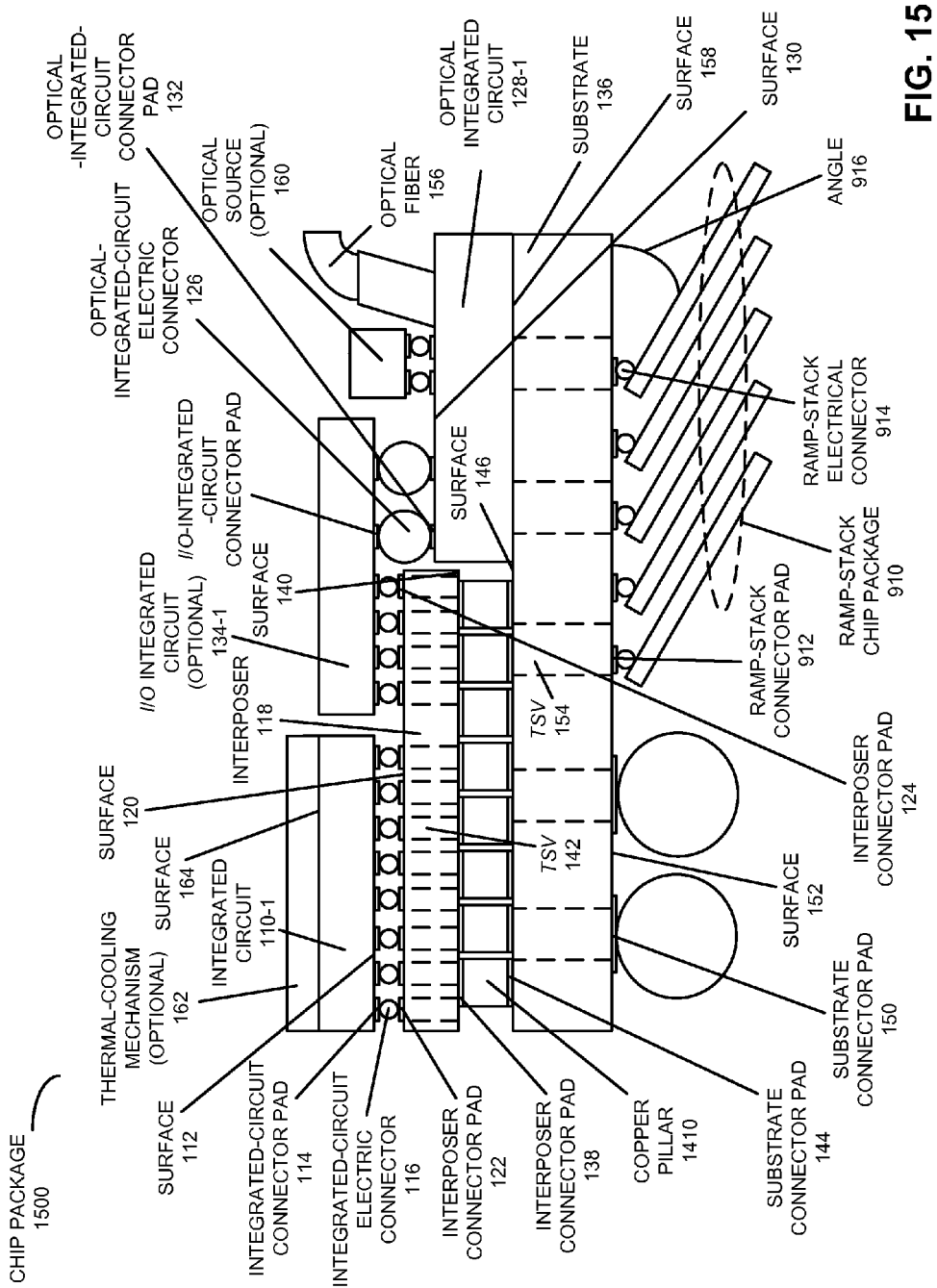
FIG. 15 is a block diagram illustrating a side view of a chip package in accordance with an embodiment of the present disclosure.

A variation on chip package 1400 is shown in FIG. 15, which presents a block diagram illustrating a side view of chip package 1500. This chip package includes ramp-stack chip package 910 electrically coupled to surface 152. In this configuration, integrated circuit 110-1 is electrically coupled to substrate 136 via interposer 118, and integrated circuit 110-1 is electrically coupled to optical integrated circuit 128-1 via optional I/O integrated circuit 134-1.

Figure 16:
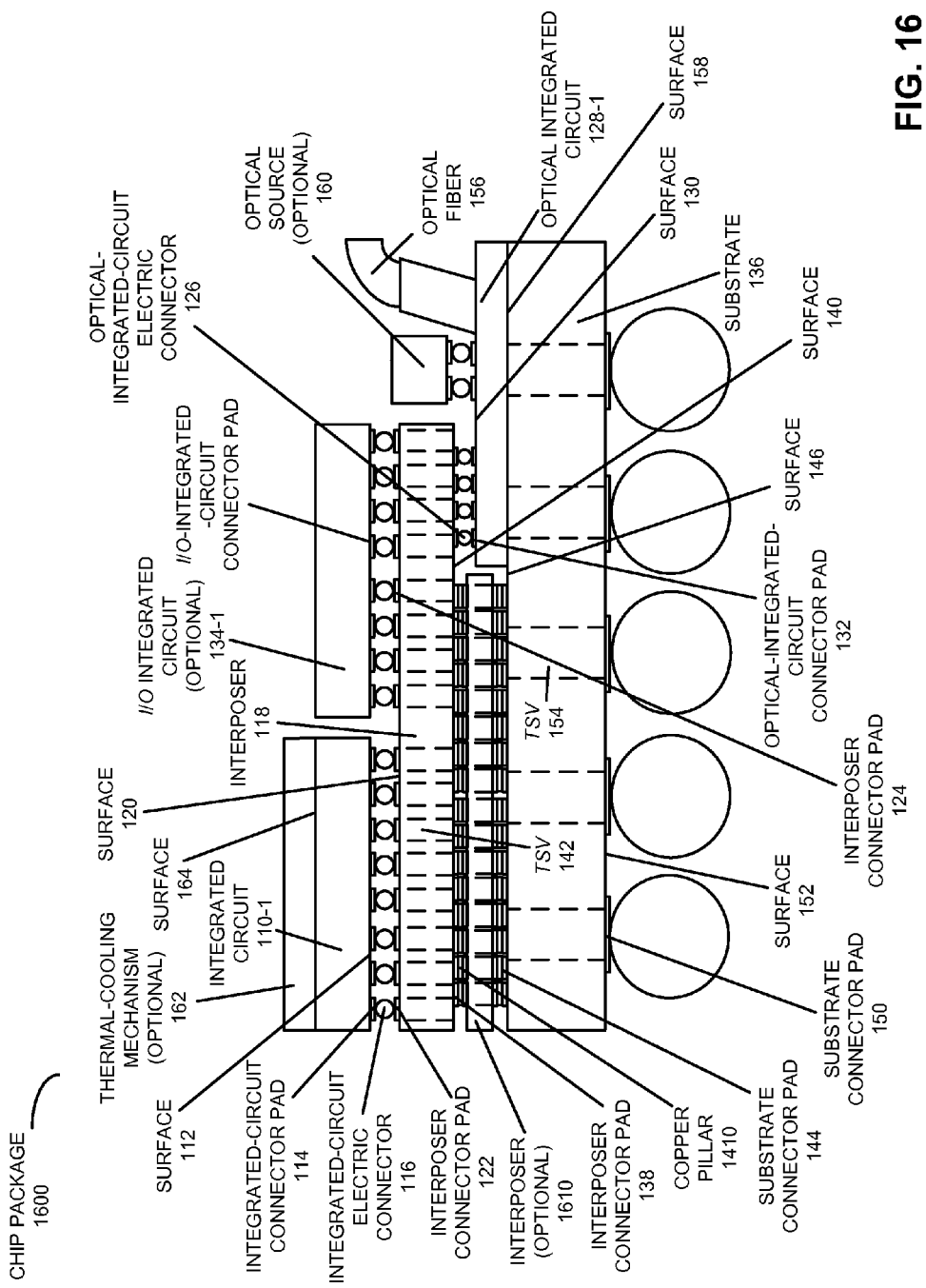
FIG. 16 is a block diagram illustrating a side view of a chip package in accordance with an embodiment of the present disclosure.

In another embodiment, electrical coupling between optical integrated circuits 128 and optional I/O integrated circuits 134 occurs via interposer 118. This is shown in FIG. 16, which presents a block diagram illustrating a side view of chip package 1600. In this chip package, the C4-type bumps between interposer 118 and substrate 136 may need to be taller than optical integrated circuits 128 and the microbumps between optical integrated circuits 128 and optional I/O integrated circuits 134. Alternatively, an optional interposer 1610 may be used as a physical-space transformer, thereby allowing shorter C4-type bumps to be used (as opposed to solder bumps having a height of 200 µm).

Figure 17:
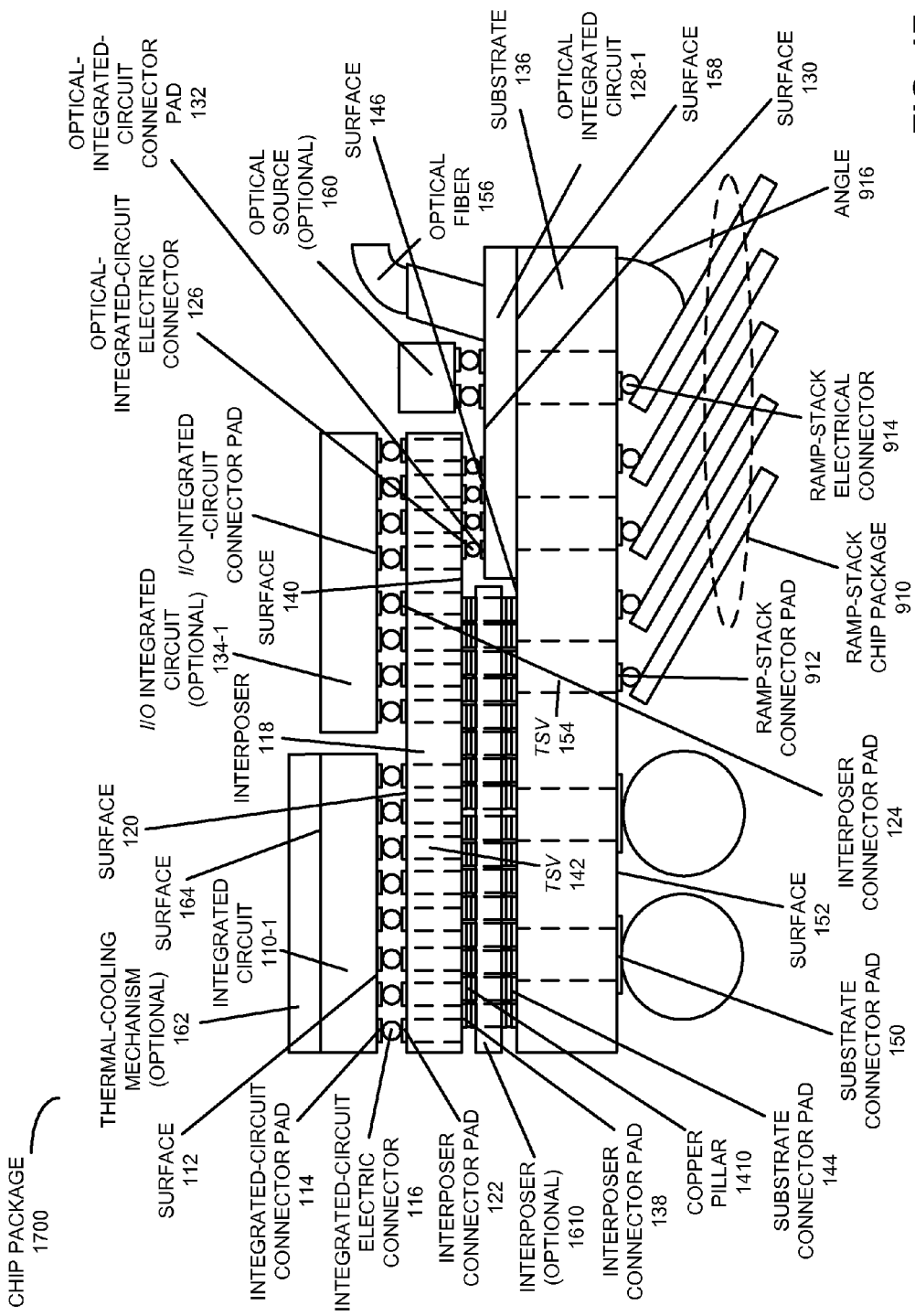
FIG. 17 is a block diagram illustrating a side view of a chip package in accordance with an embodiment of the present disclosure.

As in several of the preceding embodiments, a ramp-stack chip package may be included in chip package 1600. This is shown in FIG. 17, which presents a block diagram illustrating a side view of chip package 1700.

Figure 18:
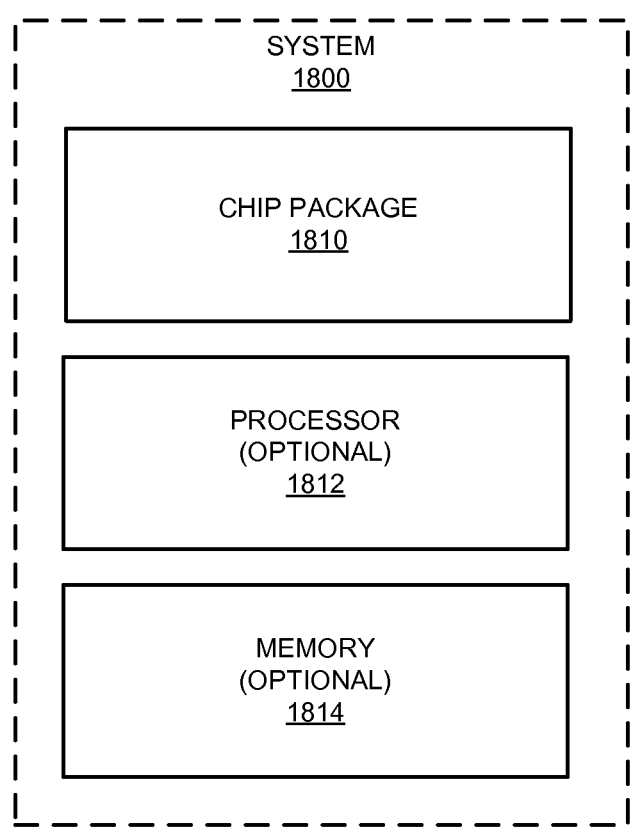
FIG. 18 is a block diagram illustrating a system that includes a chip package in accordance with an embodiment of the present disclosure.

Embodiments of the chip package may be used in a wide variety of applications. FIG. 18 presents a block diagram illustrating a system 1800 that includes a chip package 1810, such as one of the preceding embodiments of the chip package. This system may include an optional processor 1812 and/or an optional memory 1814, which may be coupled to each other and chip package 1810 by a bus (not shown). Note that optional processor (or processor core) 1812 may support parallel processing and/or multi-threaded operation.

Optional memory 1814 in system 1800 may include volatile memory and/or non-volatile memory. More specifically, optional memory 1814 may include: ROM, RAM, EPROM, EEPROM, flash, one or more smart cards, one or more magnetic disc storage devices, and/or one or more optical storage devices. Moreover, optional memory 1814 may store an operating system that includes procedures (or a set of instructions) for handling various basic system services for performing hardware-dependent tasks. Moreover, optional memory 1814 may also store communications procedures (or a set of instructions) in a communication module. These communication procedures may be used for communicating with one or more computers, devices and/or servers, including computers, devices and/or servers that are remotely located with respect to the system 1800.

Furthermore, optional memory 1814 may also include one or more program modules (or sets of instructions). Note that the one or more program modules may constitute a computer-program mechanism. Instructions in the various modules in optional memory 1814 may be implemented in: a high-level procedural language, an object-oriented programming language, and/or in an assembly or machine language. The programming language may be compiled or interpreted, i.e., configurable or configured, to be executed by optional processor (or processor core) 1812.

System 1800 may include, but is not limited to: a server, a laptop computer, a communication device or system, a personal computer, a work station, a mainframe computer, a blade, an enterprise computer, a data center, a portable-computing device, a tablet computer, a cellular telephone, a supercomputer, a network-attached-storage (NAS) system, a storage-area-network (SAN) system, an electronic device, and/or another electronic computing device.

Note that embodiments of the chip package may be used in a variety of applications, including: VLSI circuits, communication systems (such as in wavelength division multiplexing), storage area networks, data centers, networks (such as local area networks), memory systems and/or computer systems (such as multiple-core processor computer systems). For example, the chip package may be included in a backplane that is coupled to multiple processor blades, or the chip package may couple different types of components (such as processors, memory, input/output devices, and/or peripheral devices). Thus, the chip package may perform the functions of: a switch, a hub, a bridge, and/or a router.

In general, system 1800 may be at one location or may be distributed over multiple, geographically dispersed locations.

Moreover, some or all of the functionality of system 1800 may be implemented in one or more application-specific integrated circuits (ASICs) and/or one or more digital signal processors (DSPs). Furthermore, functionality in the preceding embodiments may be implemented more in hardware and less in software, or less in hardware and more in software, as is known in the art.

The preceding embodiments may include fewer components or additional components. For example, components in the chip package may be electrically coupled to each other using proximity-communication (P×C) connectors on surfaces of the components, such as: capacitive P×C connectors, inductive P×C connectors, conductive P×C connectors, and/or optical P×C connectors. Alternatively or additionally, the connectors may include compression-compliant microspring connectors. Moreover, components or features in one embodiment may be used in another of the embodiments.

In some embodiments, the interposers in the preceding embodiments include passive components (such as capacitors, power and ground planes, etc.) to decouple the electrical signals. However, in other embodiments the interposers include active circuits, such as those used for signal conditioning.

The chip package may also include additional features that facilitate assembly and that may help maintain in-plane (XY) alignment of components. In particular, components (such as integrated circuit 110-1 and/or optical integrated circuit 128-1 in FIG. 1) may be mechanically coupled to interposer 118 in FIG. 1 by pairs of negative features on surfaces and positive features that mate with the corresponding pairs of negative features. For example, the negative features may include pits that are recessed below surfaces 112, 120 and 130 in FIG. 1, and the positive features may include spherical balls that mate with the negative features (such as a ball-and-etch-pit structure), thereby aligning the components. (Alternatively or additionally, alignment in the chip package may be facilitated using positive features on surfaces 112, 120 and 130 in FIG. 1, where these positive features protrude above these surfaces). In some embodiments, the pairs of negative features are proximate to corners of the components.

As noted above, mating the negative features and the positive features can provide highly accurate self-alignment in the XY plane of the components, as well as coplanarity control during assembly. For example, the alignment over surfaces 112, 120 and/or 130 in FIG. 1 may be within ±1 µm in the XY plane.

In some embodiments, components in the chip package are permanently attached after remateable alignment, for example, by using a post-alignment technique to permanently fix the chip-to-chip alignment. In particular, solder may be partially melted or reflowed at an elevated temperature to fuse components in the chip package to create a more permanent bond. However, in other embodiments, components in the chip package are remateably coupled, thereby facilitating rework of the chip package.

Moreover, although the chip package and the system are illustrated as having a number of discrete items, these embodiments are intended to be functional descriptions of the various features that may be present rather than structural schematics of the embodiments described herein. Consequently, in these embodiments, two or more components may be combined into a single component and/or a position of one or more components may be changed. Furthermore, features in two or more of the preceding embodiments may be combined with one another.

Note that surfaces on components should be understood to include surfaces of substrates or surfaces of layers deposited on these substrates (such as a dielectric layer deposited on a substrate). Additionally, note that components in the chip package may be fabricated, and the chip package may be assembled, using a wide variety of techniques, as is known to one of skill in the art.

Figure 19:
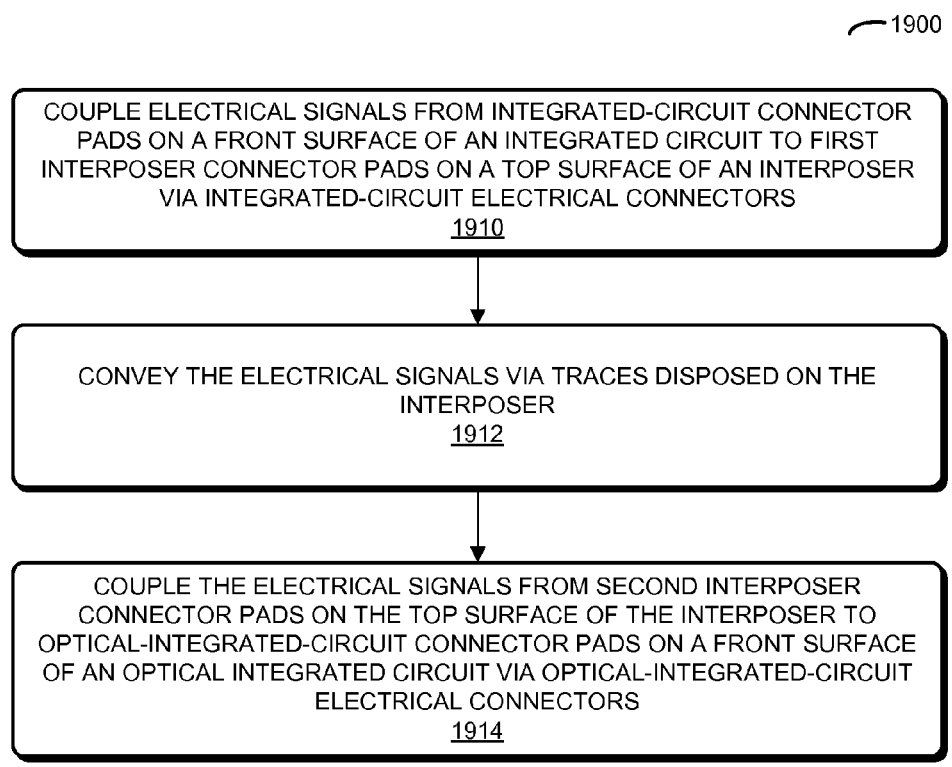
FIG. 19 is a flow diagram illustrating a method for communicating electrical signals between an integrated circuit and an optical integrated circuit in accordance with an embodiment of the present disclosure.

We now describe the method. FIG. 19 presents a flow diagram illustrating a method for communicating electrical signals between an integrated circuit and an optical integrated circuit, such as an integrated circuit and an optical integrated circuit in one of the preceding embodiments of the chip package. During the method, the electrical signals are coupled from integrated-circuit connector pads on a front surface of the integrated circuit to first interposer connector pads on a top surface of an interposer via integrated-circuit electrical connectors (operation 1910), where the front surface faces the top surface. Then, the electrical signals are conveyed via traces disposed on the interposer (operation 1912), where the traces electrically couple the first interposer connector pads and second interposer connector pads on the top surface. Moreover, the electrical signals are coupled from the second interposer connector pads on the top surface of the interposer to optical-integrated-circuit connector pads on a front surface of an optical integrated circuit via optical-integrated-circuit electrical connectors (operation 1914), where the front surface of the optical integrated circuit faces the top surface, and the optical integrated circuit is proximate to the integrated circuit on the same side of the interposer.

Figure 20:
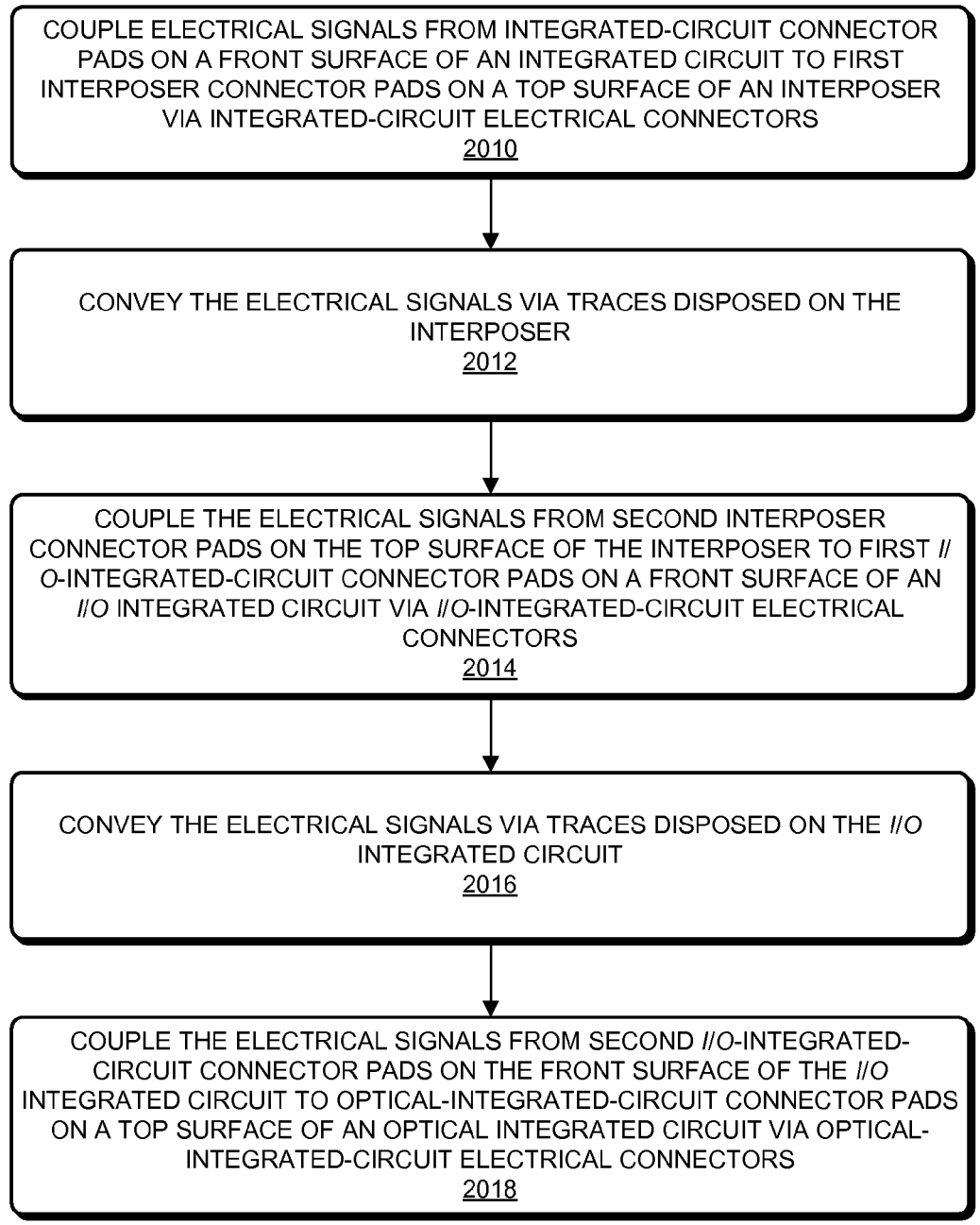
FIG. 20 is a flow diagram illustrating a method for communicating electrical signals between an integrated circuit and an optical integrated circuit in accordance with an embodiment of the present disclosure.

FIG. 20 presents a flow diagram illustrating a method for communicating electrical signals between an integrated circuit and an optical integrated circuit, such as an integrated circuit and an optical integrated circuit in one of the preceding embodiments of the chip package. During the method, the electrical signals are coupled from integrated-circuit connector pads on a front surface of the integrated circuit to first interposer connector pads on a top surface of an interposer via integrated-circuit electrical connectors (operation 2010), where the front surface faces the top surface. Then, the electrical signals are conveyed via traces disposed on the interposer (operation 2012), where the traces electrically couple the first interposer connector pads and second interposer connector pads on the top surface. Moreover, the electrical signals are coupled from the second interposer connector pads on the top surface of the interposer to first I/O-integrated-circuit connector pads on a front surface of an I/O integrated circuit via I/O-integrated-circuit electrical connectors (operation 2014). Furthermore, the electrical signals are conveyed via traces disposed on the I/O integrated circuit (operation 2016), where the traces electrically couple the first I/O-integrated-circuit connector pads and second I/O-integrated-circuit connector pads on the front surface. Next, the electrical signals are coupled from the second I/O-integrated-circuit connector pads on the front surface of the I/O integrated circuit to optical-integrated-circuit connector pads on a top surface of the optical integrated circuit via optical-integrated-circuit electrical connectors (operation 2018).

In some embodiments, methods 1900 (FIG. 19) and/or 2000 include additional or fewer operations. Moreover, the order of the operations may be changed, and/or two or more operations may be combined into a single operation.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:
1. A chip package, comprising:
an integrated circuit having a front surface with integrated-circuit connector pads;
integrated-circuit electrical connectors electrically coupled to the integrated-circuit connector pads;
an interposer having a top surface, facing the front surface of the integrated circuit, with first interposer connector pads, electrically coupled to the integrated-circuit electrical connectors, and second interposer connector pads;
input/output (I/O)-integrated-circuit electrical connectors electrically coupled to the second interposer connector pads;
an I/O integrated circuit having a front surface, facing the top surface, with first I/O-integrated-circuit connector pads electrically coupled to the I/O-integrated-circuit electrical connectors, and second I/O-integrated-circuit connector pads, wherein the I/O integrated circuit is proximate to the integrated circuit on a same side of the interposer, and wherein the I/O integrated circuit includes electrical I/O circuits and optical driver and receiver circuits;
optical-integrated-circuit electrical connectors electrically coupled to the second I/O-integrated-circuit connector pads; and
an optical integrated circuit having a top surface, facing the front surface of the I/O integrated circuit, with optical-integrated-circuit connector pads electrically coupled to the optical-integrated-circuit electrical connectors, wherein the optical integrated circuit is configured to communicate optical signals;
wherein the optical integrated circuit is placed adjacent to the interposer, and wherein a part of the I/O integrated circuit extends beyond an edge of the interposer to dispose on top of the optical integrated circuit.
2. The chip package of claim 1, wherein the integrated circuit is adjacent to the I/O integrated circuit.
3. The chip package of claim 1, wherein the interposer further includes:
third interposer connector pads disposed on a bottom surface on an opposite side of the interposer from the top surface; and
through-substrate vias (TSVs) electrically coupling the first interposer connector pads to the third interposer connector pads, and the second interposer connector pads to the third interposer connector pads.
4. The chip package of claim 3, wherein the TSVs are configured to convey power and ground to the integrated circuit and the I/O integrated circuit.
5. The chip package of claim 3, wherein the chip package further includes:
substrate electrical connectors electrically coupled to the third interposer connector pads; and a substrate having a front surface electrically coupled to the substrate electrical connectors.

6. The chip package of claim 5, wherein the chip package further includes a ramp-stack chip package electrically coupled to a back surface on an opposite side of the substrate from the top surface, and wherein the ramp-stack chip package includes multiple parallel substrates arranged at an oblique angle relative to the back surface.

7. The chip package of claim 5, wherein a back surface of the optical integrated circuit on an opposite side of the optical integrated circuit from the top surface of the optical integrated circuit is coupled to the front surface of the substrate.

8. The chip package of claim 1, wherein the chip package further includes a second interposer between the front surface of the substrate and a bottom surface of the interposer on an opposite side of the interposer from the front surface of the interposer.

9. The chip package of claim 1, wherein the chip package further includes an optical fiber edge coupled to the optical integrated circuit.

10. The chip package of claim 9, wherein the optical fiber is coupled to one of: the top surface of the optical integrated circuit; and a back surface of the optical integrated circuit on an opposite side of the optical integrated circuit from the top surface of the optical integrated circuit.

11. The chip package of claim 1, wherein the chip package further includes an optical fiber vertically coupled to the optical integrated circuit.

12. The chip package of claim 11, wherein the optical fiber is coupled to one of: the top surface of the optical integrated circuit; and a back surface of the optical integrated circuit on an opposite side of the optical integrated circuit from the top surface of the optical integrated circuit.

13. The chip package of claim 1, wherein the chip package further includes an optical source optically coupled to the optical integrated circuit.

14. The chip package of claim 1, wherein the interposer includes one of: a ceramic, an organic material, a glass, and a semiconductor.

15. The chip package of claim 1, wherein the chip package further includes a thermal-cooling mechanism on a back surface of the integrated circuit on an opposite side of the integrated circuit from the front surface of the integrated circuit.

16. A system, comprising:
a processor;
a memory coupled to the processor; and
a chip package, wherein the chip package includes:
an integrated circuit having a front surface with integrated-circuit connector pads;
integrated-circuit electrical connectors electrically coupled to the integrated-circuit connector pads;
an interposer having a top surface, facing the front surface of the integrated circuit, with first interposer connector pads, electrically coupled to the integrated-circuit electrical connectors, and second interposer connector pads;
input/output (I/O)-integrated-circuit electrical connectors electrically coupled to the second interposer connector pads;
an I/O integrated circuit having a front surface, facing the top surface, with first I/O-integrated-circuit connector pads electrically coupled to the I/O-integrated-circuit electrical connectors, and second I/O-integrated-circuit connector pads, wherein the I/O integrated circuit is proximate to the integrated circuit on a same side of the interposer, and wherein the I/O integrated circuit includes electrical I/O circuits and optical driver and receiver circuits;

optical-integrated-circuit electrical connectors electrically coupled to the second I/O-integrated-circuit connector pads; and an optical integrated circuit having a top surface, facing the front surface of the I/O integrated circuit, with optical-integrated-circuit connector pads electrically coupled to the optical-integrated-circuit electrical connectors, wherein the optical integrated circuit is configured to communicate optical signals;

wherein the optical integrated circuit is placed adjacent to the interposer, and wherein a part of the I/O integrated circuit extends beyond an edge of the interposer to dispose on top of the optical integrated circuit.

17. The system of claim 16, wherein the interposer further includes:
third interposer connector pads disposed on a bottom surface on an opposite side of the interposer from the top surface; and
through-substrate vias (TSVs) electrically coupling the first interposer connector pads to the third interposer connector pads, and the second interposer connector pads to the third interposer connector pads.

18. The system of claim 17, wherein the chip package further includes:
substrate electrical connectors electrically coupled to the third interposer connector pads; and
a substrate having a front surface electrically coupled to the substrate electrical connectors.

19. The system of claim 18, wherein the chip package further includes a ramp-stack chip package electrically coupled to a back surface on an opposite side of the substrate from the top surface, and wherein the ramp-stack chip package includes multiple parallel substrates arranged at an oblique angle relative to the back surface.

20. A method for communicating electrical signals between an integrated circuit and an optical integrated circuit, wherein the method comprises:
coupling the electrical signals from integrated-circuit connector pads on a front surface of the integrated circuit to first interposer connector pads on a top surface of an interposer via integrated-circuit electrical connectors, wherein the front surface faces the top surface;
conveying the electrical signals via traces disposed on the interposer, wherein the traces electrically couple the first interposer connector pads and second interposer connector pads on the top surface;
coupling the electrical signals from the second interposer connector pads to first input/output (I/O)-integrated-circuit connector pads on a front surface of an I/O integrated circuit via I/O-integrated-circuit electrical connectors;
conveying the electrical signals via traces disposed on the I/O integrated circuit, wherein the traces electrically couple the first I/O-integrated-circuit connector pads and second I/O-integrated-circuit connector pads on the front surface; and
coupling the electrical signals from the second I/O-integrated-circuit connector pads to optical-integrated-circuit connector pads on a top surface of an optical integrated circuit via optical-integrated-circuit electrical connectors;
wherein the optical integrated circuit is placed adjacent to the interposer, and wherein a part of the I/O integrated circuit extends beyond an edge of the interposer to dispose on top of the optical integrated circuit.

* * * * *